United States Patent [19]

Saitoh et al.

[11] Patent Number: 5,634,003
[45] Date of Patent: May 27, 1997

[54] LOGIC SIMULATION APPARATUS BASED ON DEDICATED HARDWARE SIMULATING A LOGIC CIRCUIT AND SELECTABLE TO FORM A PROCESSING SCALE

[75] Inventors: Minoru Saitoh, Kawasaki; Toshihide Sasaki, Shioya-gun; Hiroshi Tsukamoto, Shioya-gun; Michinori Yajima, Shioya-gun; Hiroaki Komatsu, Kawasaki, all of Japan

[73] Assignees: Fujitsu Limited; Fujitsu Automation Limited, both of Kawasaki, Japan

[21] Appl. No.: 547,319

[22] Filed: Oct. 24, 1995

Related U.S. Application Data

[63] Continuation of Ser. No. 236,140, May 2, 1994, abandoned.

[30] Foreign Application Priority Data

Jul. 7, 1993 [JP] Japan .................................. 5-167959

[51] Int. Cl.$^6$ .................................................. G06F 13/00
[52] U.S. Cl. ............................ 395/200.1; 395/200.15
[58] Field of Search ........................... 395/200.1, 200.15

[56] References Cited

U.S. PATENT DOCUMENTS

| | | | |
|---|---|---|---|
| 4,590,581 | 5/1986 | Widdoes, Jr. ........................ | 364/578 |
| 4,758,985 | 7/1988 | Carter ................................. | 365/94 |
| 4,775,950 | 10/1988 | Terada et al. ...................... | 364/578 |
| 4,782,440 | 11/1988 | Nomizu et al. .................... | 364/200 |
| 4,942,615 | 7/1990 | Hirose ................................. | 364/578 |
| 5,036,473 | 7/1991 | Butts et al. ......................... | 364/489 |
| 5,093,920 | 3/1992 | Agrawal et al. .................... | 395/800 |
| 5,161,156 | 11/1992 | Baam et al. ........................ | 371/7 |
| 5,329,470 | 7/1994 | Sample et al. ..................... | 364/578 |
| 5,392,446 | 2/1995 | Tower et al. ....................... | 595/800 |

Primary Examiner—Krisna Lim
Attorney, Agent, or Firm—Staas & Halsey

[57] ABSTRACT

In a logic simulation apparatus formed of dedicated hardware for simulating a logic operation of at least one logic circuit, and connected to at least one host computer, the apparatus includes: a plurality of clusters, each cluster including at least a communication network and a plurality of processor elements connected each other through the communication network; and an upper communication network for connecting among clusters. The host computer is connected to at least one cluster, and the connection configuration among the plurality of clusters is changeable in accordance with the size of the logic operation to be simulated under instructions of configuration change generated by the host computer. The apparatus further includes an error analysis system for the simulation process.

18 Claims, 18 Drawing Sheets

Fig.3A

EVENT FORMAT

| TRACE FLAG | PE-NO | GATE-NO | EVENT STATE |
|---|---|---|---|

Fig.3B

| TRACE FLAG | DESTINATION PE-NO | DESTINATION GATE-NO | EVENT STATE |
|---|---|---|---|
| 0 | PE 15 (1111) | 200 | 0 → 1 |

Fig.3C

| TRACE FLAG | PROCESSOR'S OWN PE-NO | PROCESSOR'S OWN GATE-NO | EVENT STATE |
|---|---|---|---|
| 1 | PE 00 (0000) | 100 | 0 → 1 |

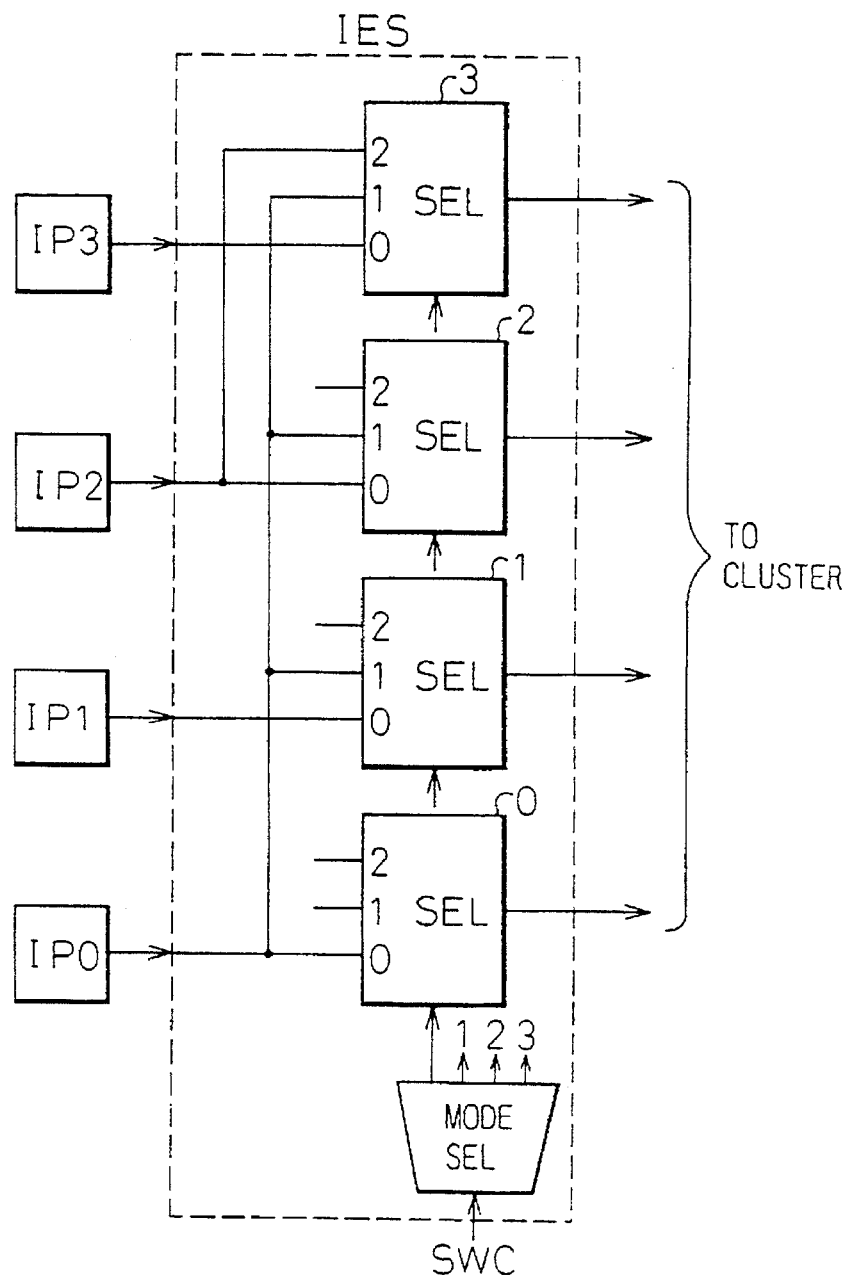

LOGIC SIMULATION APPARATUS BASED ON DEDICATED HARDWARE SIMULATING A LOGIC CIRCUIT AND SELECTABLE TO FORM A PROCESSING SCALE This application is a continuation of application Ser. No. 236,140, filed May 2, 1994, now abandoned.

BACKGROUND OF THE INVENTION

1. Field of the Invention

The present invention relates to a logic simulation apparatus which simulates the logic operation of a logic circuit designed by a circuit designer using a computer system. The logic simulation apparatus according to the present invention is realized by dedicated hardware which can execute logic simulation at a high speed. Further, the logic simulation apparatus according to the present invention includes a highly reliable system which can easily perform error analysis during simulation process.

2. Description of the Related Art

Before providing a logic circuit by actual hardware and starting actual production of the circuit, it is necessary to simulate logic operation of the designed logic circuit in order to confirm whether it provides the desired performance. Particularly, since large scale and very complicated logic circuits are now used in computer systems, it is very important to simulate such logic circuits at a high speed before producing actual hardware.

A logic simulation apparatus is used for simulating such logic circuit using a computer system. That is, the logic circuit to be simulated (i.e., a model logic circuit) is provided in the logic simulation apparatus, and a certain test pattern is input to the logic circuit to check the operation thereof.

In general, logic simulation is realized by using software on a computer system. However, recently, logic simulation is performed using dedicated hardware to realize a high-speed simulation process. A logic simulation apparatus according to the present invention is realized by using dedicated hardware to achieve high speed logic simulation process.

Further, there are known three representative algorithms for dedicated hardware for logic simulation, i.e., a level-sorting method, an exhaustive method, and an event driven method. The present invention is mainly used for the event driven method.

In the dedicated hardware for logic simulation, it is necessary to increase the size of the dedicated hardware in accordance with the size of the logic circuit to be simulated. Accordingly, for example, the dedicated hardware used for simulation of a general purpose computer, a super computer, etc., becomes very large and expensive.

Further, conventional dedicated hardware for logic simulation is used for only one simulation process, and cannot be used for another simulation process at the same time. Accordingly, throughput of the dedicated hardware falls because another simulation process must wait until completion of previous simulation process.

Still further, for example, if a very large dedicated hardware is used for a small simulation process, utilization efficiency of the dedicated hardware falls.

SUMMARY OF THE INVENTION

One object of the present invention is to provide a logic simulation apparatus in which the size of the dedicated hardware for simulation can be changed in accordance with the scale of the logic circuit to be simulated, and can also execute a plurality of logic simulations in parallel.

Another object of the present invention is to provide a logic simulation apparatus having high reliability by easily executing error analysis during simulation process.

In accordance with the present invention, there is provided a logic simulation apparatus formed of dedicated hardware for simulating logic operation of at least one logic circuit, and connected to at least one host computer. The logic simulation apparatus of the present invention includes a plurality of clusters, each cluster including at least a communication network and a plurality of processor elements connected each other through the communication network, and an upper communication network for connecting among the clusters. The host computer is connected to at least one cluster, and the connection configuration among a plurality of clusters is changable in accordance with the scale of the logic operation to be simulated under instructions for configuration change generated by the host computer.

In one preferred embodiment, the connection configuration among clusters is changed in such a way that each cluster is selected so as to form a desired processing scale for simulation; all clusters are selected to form a plurality of cluster group in accordance with the processing scale for simulation, and each cluster group is operated independently of each other; and all clusters are selected to form one processing scale for simulation.

In another preferred embodiment, the cluster further comprises an event communication network for connecting among the processor elements and transferring an event packet thereamong, an input processor connected to the event communication network through a signal line and inputting the event packet, an output processor connected to the event communication network through the signal line and storing a history of the event packet, an interface controller connected to the host computer through a channel and further connected to the processor elements through a system bus, and a control processor operatively connected to the system bus for controlling the operation of each processor element.

In still another preferred embodiment, the logic simulation apparatus further includes an input event selector connected between the input processor and the event communication network for selecting at least one cluster, a plurality of switch units for connecting between adjacent clusters, and a configuration control processor operatively connected to the host computer through the channel for receiving a switching control instruction input from the host computer and generating a switching command to the input event selector in order to form the processing scale for simulation.

In still another preferred embodiment, each of the plurality of processor elements has a successive number which is defined by "n" bits, for example, four bits, and communication between processor elements is performed by transferring the event packet which is formed of a processor number, a gate number and an event state.

In still another preferred embodiment, the event communication network includes a plurality of communication units which are formed of a hierarchical stage, each communication unit includes a plurality of communication elements which are formed of a hierarchical layer, and the communication elements of the lowest layer are connected to the processor elements and defined by the same number as the corresponding processor element.

In still another preferred embodiment, the communication element of the upper layer is connected to the communication elements of the lower layer, and defined by the same number as the first processor element to which the upper communication element belongs.

In still another preferred embodiment, the communication element compares the number of the destination processor element, which is provided in the event packet, with the element's own number, and determines whether the event packet should be passed-on in accordance with a result of the comparison.

In still another preferred embodiment, as a result of the comparison in the communication element, a passing route for the event packet is changed in accordance with a change of the configuration of clusters.

In still another preferred embodiment, each of the communication elements has an element address which is formed of a mode for indicating the configuration of the clusters, a hierarchical stage for indicating the location of the communication unit, direction of event which is transferred in the communication element, and the number of the communication element.

In still another preferred embodiment, the input event selector includes "n" units, for example, four selection units and one mode selection unit, each selection unit being connected to the corresponding input processor, each input processor being selected so as to transfer the event packet from each input processor to the corresponding cluster when each cluster operates independently, and one input processor being selected so as to transfer the event packet from one input processor to all clusters.

In still another preferred embodiment, the output processor stores data previously designated by the host computer to be simulated in its own cluster through the communication network; and when each cluster operates independently, the host computer reads the contents of each output processor after completion of simulation process, and when all clusters operate integratedly, one host computer reads the contents of all output processors after completion of the simulation process.

In still another preferred embodiment, the control processor always checks data previously designated by the host computer to be simulated in its own cluster through the communication network and detects change of the data; and when each cluster operates independently, the control processor stops the simulation process when a stop condition is generated based on a result of check in each output processor, and when all clusters operate integratedly, the control processor stops the simulation process when the stop condition is generated based on a result of check in any one output processor.

In still another preferred embodiment, the configuration control processor acquires the present state of other clusters through the interface controller, returns the state of other clusters, i.e., whether the simulation process is performed, when receiving a query from the host computer, changes the configuration of the clusters after completion of the simulation process, and forcedly completes the simulation process in accordance with the instructions from the host computer when any one cluster does not complete the simulation process.

In still another preferred embodiment, the host computer is connected to the logic simulation apparatus through an access operation route, and processor elements are connected to the communication network through a system operation route within the logic simulation apparatus.

In still another preferred embodiment, the access operation route is used for error analysis of the apparatus and corresponds to the system bus, and the system operation route is used for simulation process of the apparatus and corresponds to the signal line.

In still another preferred embodiment, each structural unit, i.e., the input/output/control processors, the communication network, and processor elements, in the logic simulation apparatus include a partial circuit for error analysis in the structural unit through the access operation route.

In still another preferred embodiment, the partial circuit comprises a plurality of RAS (Reliability, Availability and Serviceability) circuit, i.e., an ECC circuit, for checking the operation of the partial circuit, a plurality of registers for storing the result of the check at the RAS circuit, and flip-flops for defining the errors in each partial circuit.

In still another preferred embodiment, a plurality of counter unit are provided on the system operation route connecting among partial circuits for counting valid data which are transferred to the communication units.

BRIEF DESCRIPTION OF THE DRAWINGS

In the drawings:

FIGS. 3A, 3B and 3C show one example of an event packet used in the present invention;

FIG. 5 is a detailed block diagram of an input event selector shown in FIG. 4;

FIG. 6 shows one example of a format of an ETE address used in the present invention;

DESCRIPTION OF THE PREFERRED EMBODIMENTS

Figure 1:
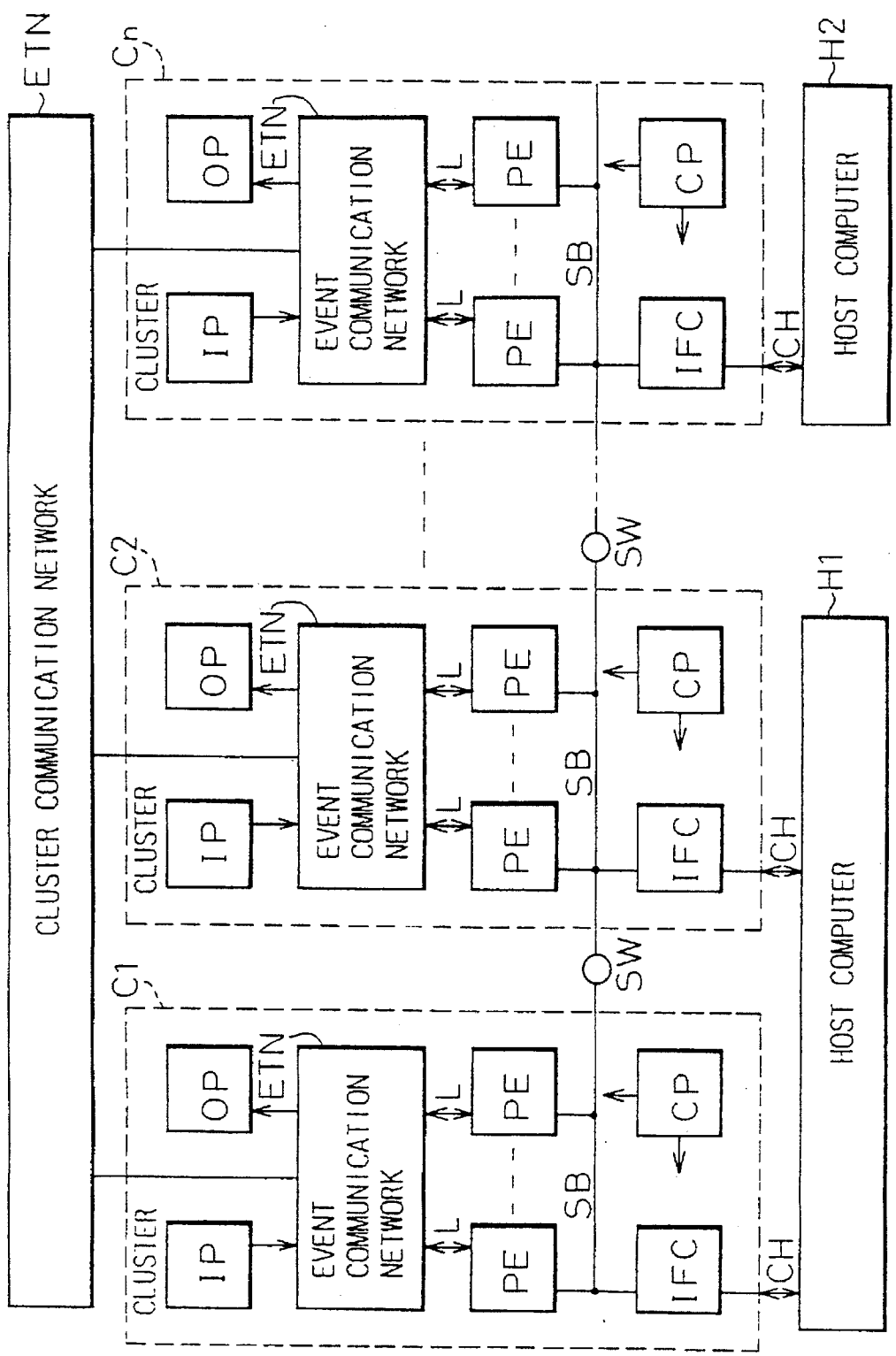
FIG. 1 is a basic structural view of a logic simulation apparatus according to the present invention.

FIG. 1 is a basic structural view of a logic simulation apparatus according to the present invention. In FIG. 1, C1 to Cn denote a plurality of clusters each of which is formed of a plurality of processor elements PE. The reference letter ETN denotes a communication network. As shown in the drawing, the communication network ETN is provided for communication among clusters and for communication among processor elements within the cluster. The former is called a cluster communication network, and the latter is called an event communication network. However, the cluster communication network and the event communication network have the same structure. Further, the number of the clusters is changed in accordance with configuration of the logic simulation apparatus.

Reference letters H1 and H2 denote host computers and each host computer is provided in accordance with configuration of the logic simulation apparatus. Each cluster is connected to an adjacent cluster by a switch element SW through a system bus SB, and the host computer H is connected to the cluster through a channel CH. Preferably, the switch element SW is formed of a tri-state buffer. The switch element SW can be switched to independently transfer data from the host computer H to the cluster C, or to transfer data from any one interface controller IFC to all clusters.

Further, each cluster includes a plurality of processor elements PE in order to execute the simulation process, an interface controller IFC, a control processor CP, an input processor IP, and an output processor OP. The input processor IP and the output processor OP are connected to processor elements PE through the event communication network ETN. The interface controller IFC is connected to processor elements PE through the system bus SB, and further connected to the host computer H through the channel CH.

Still further, reference letter L denotes a signal line which is mainly used for simulation process (i.e., system operation route as explained below), and the system bus SB is mainly used for data loading and error analysis (i.e., access operation route as explained below).

A plurality of processor elements PE are provided for executing the simulation process. The interface controller IFC is provided for communicating data between the host computer H and the processor element PE. The control processor CP generates a clock signal to the processor elements PE in order to realize synchronized operation among processor elements PE. The input processor IP sends data and an "event" to the processor element PE. In general, the "event" is defined as information which indicates a change in a signal at a gate provided in the processor element PE. The output processor OP stores the "event". The event communication network ETN is provided for connection among processor elements PE and connection between the input processor IP and the output processor OP.

The interface controller IFC is connected to the host computer H through the channel CH, and further connected to a plurality of processor elements PE through the system bus SB in order to read/write data to/from buffers or registers (see, FIGS. 13 to 18) in the processor element PE.

Figure 2:
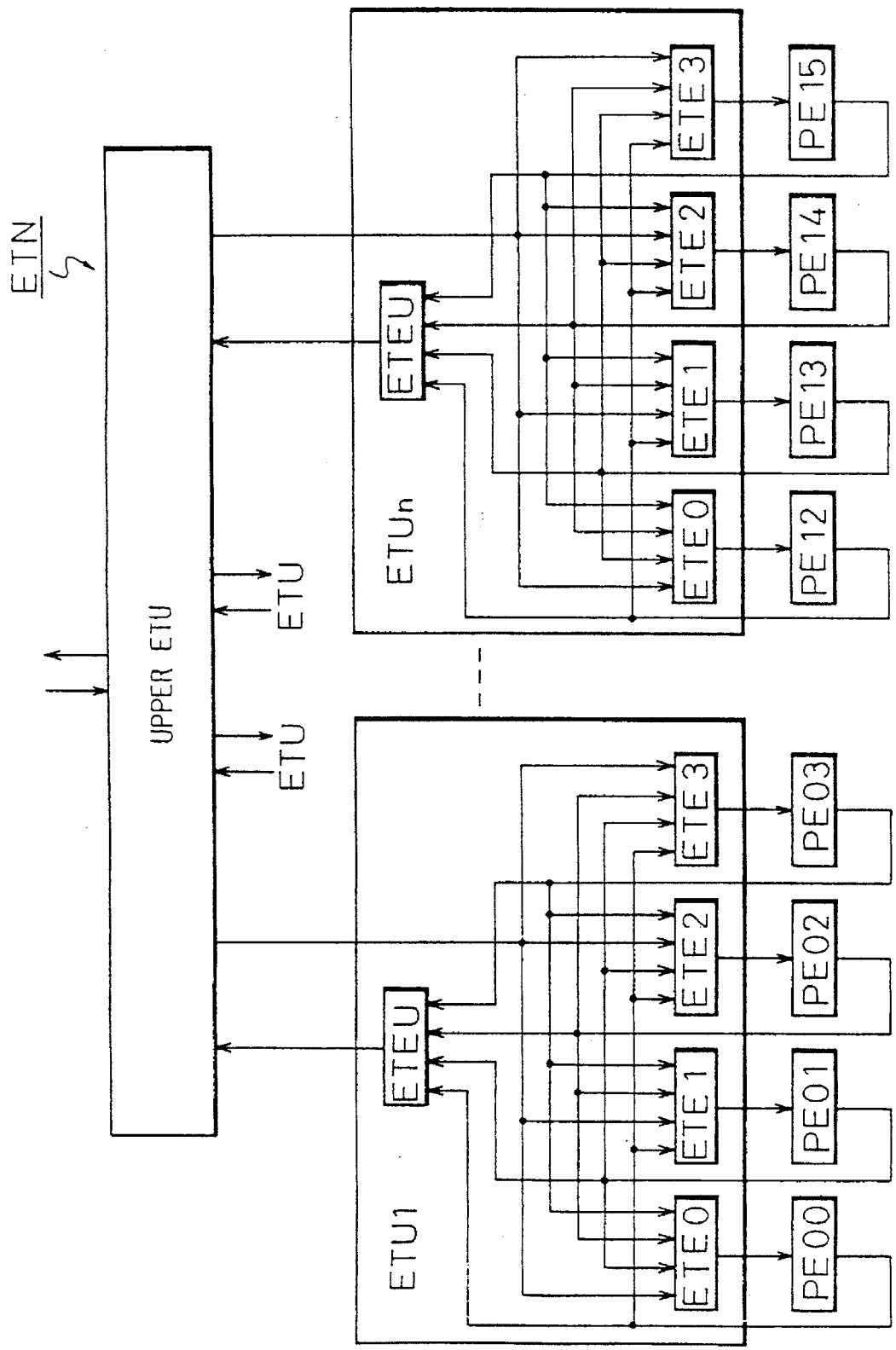
FIG. 2 is a detailed block diagram of a communication network shown in FIG. 1.

FIG. 2 is a detailed block diagram of the communication network shown in FIG. 1. The communication network ETN is formed by a plurality of communication units ETU1 to ETUn and an upper unit ETU. Further, each unit ETU0 to ETUn is formed of a plurality of communication elements ETE0 to ETE3 and ETEU. As shown in the drawing, the communication units and elements have a hierarchical structure. That is, the communication units ETU are formed, for example, in two stages, and the communication elements ETE are formed, for example, in two layers.

In this embodiment, each communication unit ETU is formed of five communication elements, i.e., four elements ETE0 to ETE3 provided the lowest layer, and one element ETEU of the upper layer which is connected to all elements ETE0 to ETE3. Each communication element ETE is connected to the processor element PE in order to perform event communication among processor elements PE.

FIGS. 3A to 3C show one example of an event packet used in the present invention. FIG. 3A shows a basic event packet, FIG. 3B shows the case that a trace flag indicates "0", and FIG. 3C shows the case that the trace flag indicates "1". In FIG. 3A, the event packet is formed of a trace flag section, a PE number section (PE-No), a gate number section (GATE-No), and an event state section.

As shown in FIG. 3B, the trace flag is set, for example, to "0" when the event packet is transferred, for example, from the processor element PE00 to the processor element PE15 in order to send change of the event state. Accordingly, the processor number PE-No is shown by the destination processor number (PE15).

As shown in FIG. 3C, the trace flag is set, for example, to "1" when the event packet is stored in the processor's own output processor OP. Accordingly, the processor number PE-No is shown by the processor's own number (PE00).

In these cases, each processor has the gate (not shown), for example, gates No. 100 and 200, respectively. As explained above, the "event" shows information indicating change of signal, for example, 0 to 1, at the gate. Accordingly, in the above case of FIGS. 2 and 3, when an output of the gate 100 of the processor element PE00 is changed from "0" to "1", this change is informed to the gate 200 of the processor PE15 as the event.

How to inform the event will be explained in detail with reference to FIGS. 7 to 9. Briefly, the event packet is sent from the processor of the transmission side to the processor of the reception side in accordance with coincidence or non-coincidence of the processor number PE-No and the ETE address which corresponds to the processor number.

Figure 4:
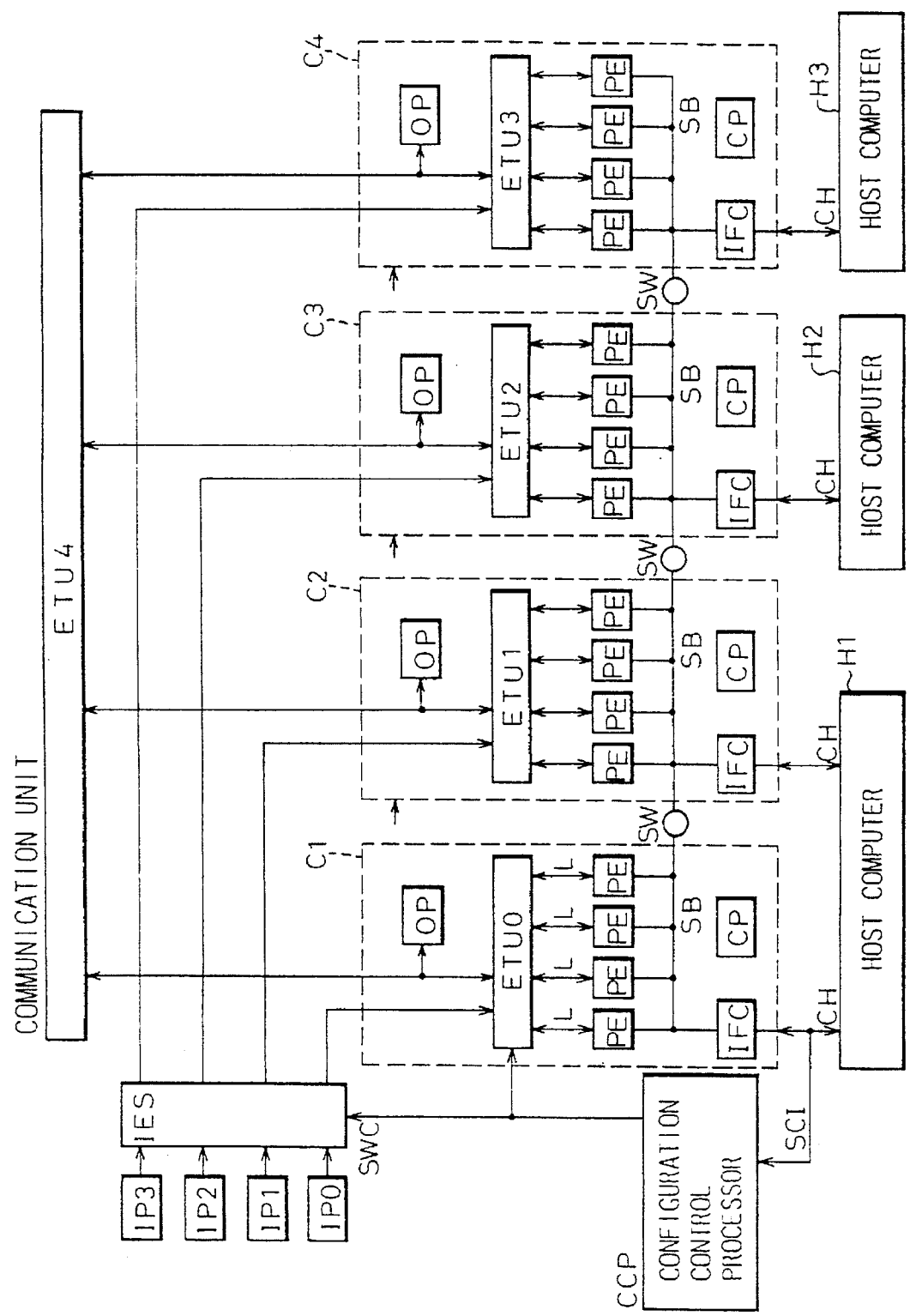
FIG. 4 is a schematic block diagram of a logic simulation apparatus according to an embodiment of the present invention.

FIG. 4 is a schematic block diagram of a logic simulation apparatus according to an embodiment of the present invention. In this embodiment, each cluster includes four processor elements PE, and the logic simulation apparatus is formed of four clusters C1 to C4 connected through the communication unit ETU4. The communication units ETU0 to ETU4 have the same structure as shown in FIG. 2.

The host computer H1 is coupled to the clusters C1 and C2, the host computer H2 is coupled to the cluster C3, and the host computer H3 is coupled to the cluster C4, respectively. Further, IES denotes an input event selector, and CCP denotes a configuration control processor. Still further, SWC denotes a switching command generated by the configuration control processor CCP, and SCI denotes a switching control instruction generated by the host computer H.

Although four processor elements PE are shown in one cluster in order to simplify explanation, $4^n$ processor elements PE can be provided theoretically in one cluster (where, "n" indicates the number of layers of communication units ETU) (i.e., 4, 16, 64, 128, . . .,). For example, when n=2, it is possible to provide sixteen processor elements PE in one cluster. In this embodiment of FIG. 4, the communication network ETN of FIG. 1 is formed of five communication units ETU0 to ETU4. The communication unit ETU4 is used for communication among clusters C1 to C4.

The configuration control processor CCP is provided for changing the configuration of the logic simulation apparatus in accordance with the switching instruction SCI generated by the host computer H1 through the channel CH. The input event selector IES is provided for switching four input processors IP0 to IP3 in accordance with the configuration switching command SWC generated by the configuration control processor CCP. The detailed structure of the input event processor IES is shown in FIG. 5 and explained in detail hereinafter.

In this embodiment, it is possible to provide the following five configurations, i.e., (4 PEs×4), (8 PEs×2), (4 PEs×2+8 PEs), (4 PEs+12 PEs), and (16 PEs×1).

The change of the configuration of the logic simulation apparatus is performed by the switching control instruction SCI from the host computer H1 to the configuration control processor CCP. The configuration control processor CCP generates the switching command SWC to the input event selector IES, and determines the ETE address in each event communication unit ETU. The ETE address is written into an ETE address register in each event communication unit ETU. The ETE address is shown in FIG. 6 and explained in detail hereinafter.

FIG. 5 is a detailed block diagram of an input event selector shown in FIG. 4. As shown in the drawing, the input event selector IES is formed of four selectors SEL0 to SEL3 each having three input terminals 0 to 2, and a mode selector MODE SEL to decode the switching command SWC. The input processors IP0 to IP3 are connected to the corresponding selectors SEL0 to SEL3. The switching command SWC is input to the mode selector MODE SEL from the configuration control processor CCP, and the mode selector decodes the designated mode and sends it to the corresponding selectors SEL in order to select the input processor IP.

In this embodiment of FIG. 4, when four clusters are used as one cluster (16 PEs×1 as explained below), the selector SEL0 is "0" and the selectors SEL1 to SEL3 are "1". When four clusters are independently used (4 PEs×4), all selectors SEL0 to SEL3 are "0". When four clusters are used as two clusters (8 PEs×2), the selectors SEL0 and SEL2 are "0", the selector SEL1 is "1" and the selector SEL3 is "2".

Further, the configuration control processor CCP can communicate with the interface controller IFC, and each interface controller IFC informs the state of the cluster (i.e., used or not used) to the configuration control processor CCP. Still further, the configuration control processor CCP informs the present state of the cluster to the host computer. In accordance with the switching control instruction SCI from the host computer, the configuration control processor CCP can change the configuration of the cluster when all clusters are not used, or when all clusters are forcedly stopped.

FIG. 6 shows one example of format of the ETE address applied to the present invention. In FIG. 6, the "mode" indicates the configuration of the cluster, the stage indicates the lower/upper stage of the communication unit which is expressed by the ETE address, and the "U/D" indicates direction of flow of the event packet, i.e., upward/downward directions of the event packet. The processor number PE-No and the event communication element ETE-No are formed of four bits in this embodiment. The example of the ETE address is shown in FIGS. 7 to 9.

Figure 7:
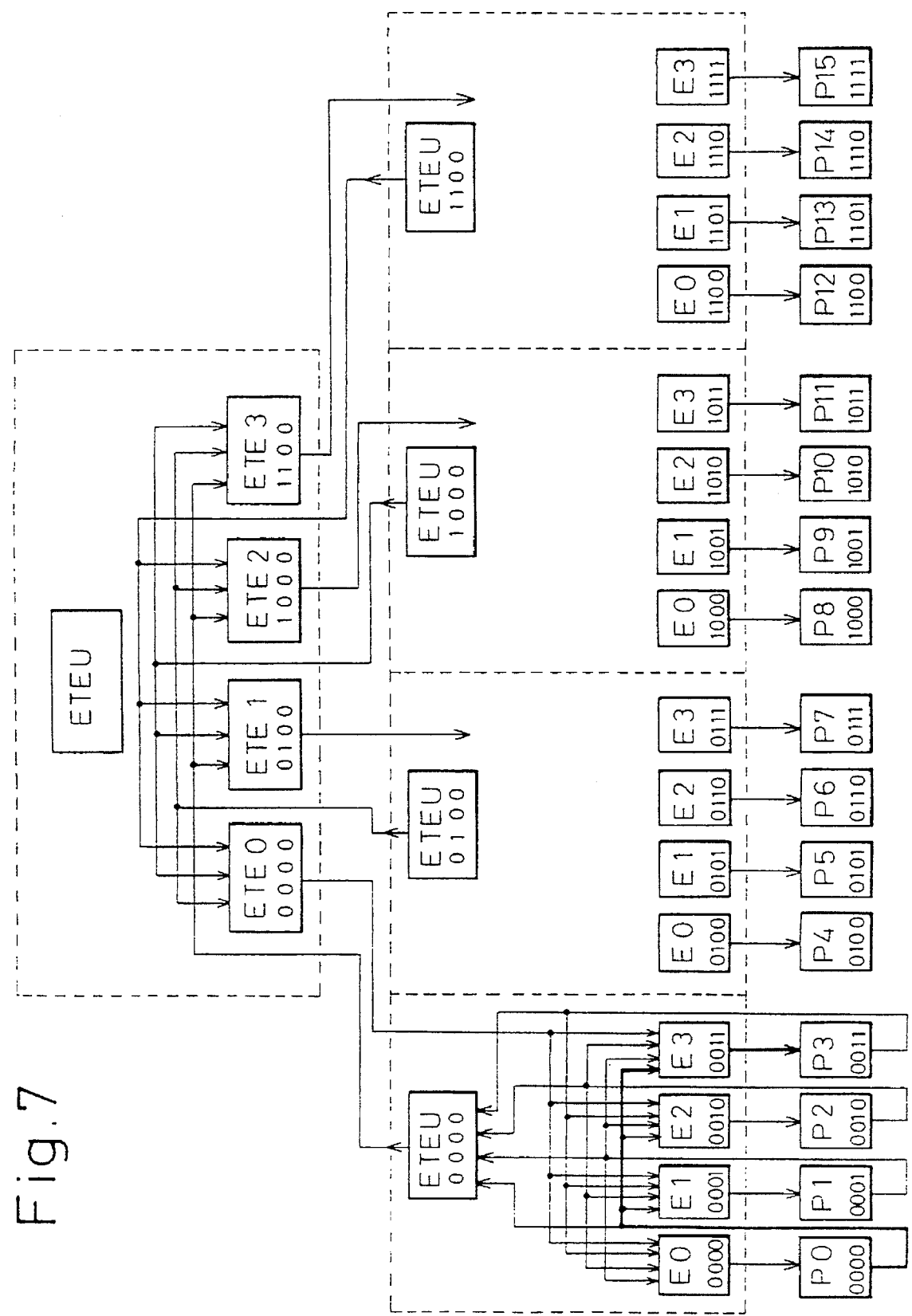
FIGS. 7, 8 and 9 are explanatory views for flow of the event packet according to the present invention.
Figure 8:
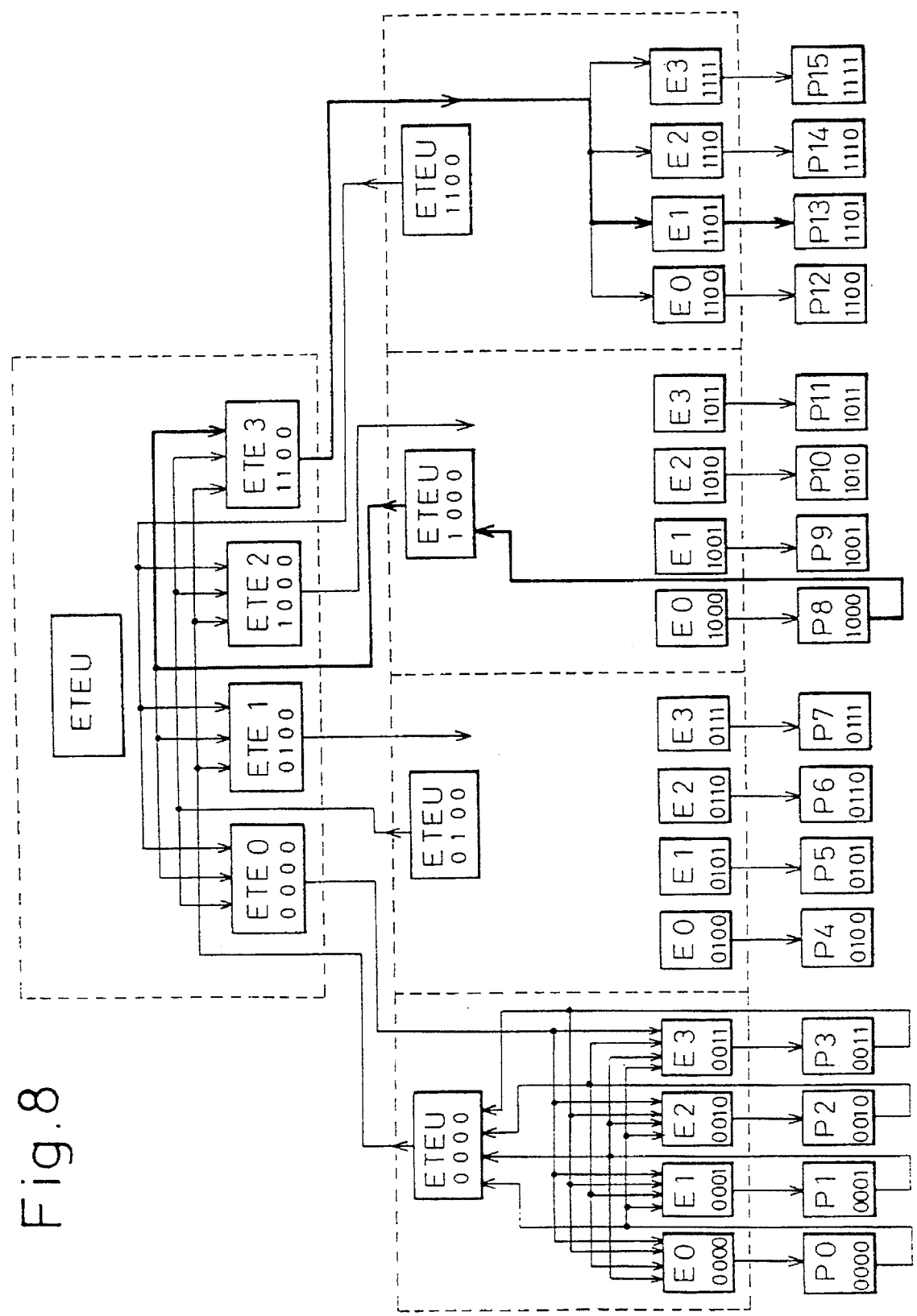
Figure 9:
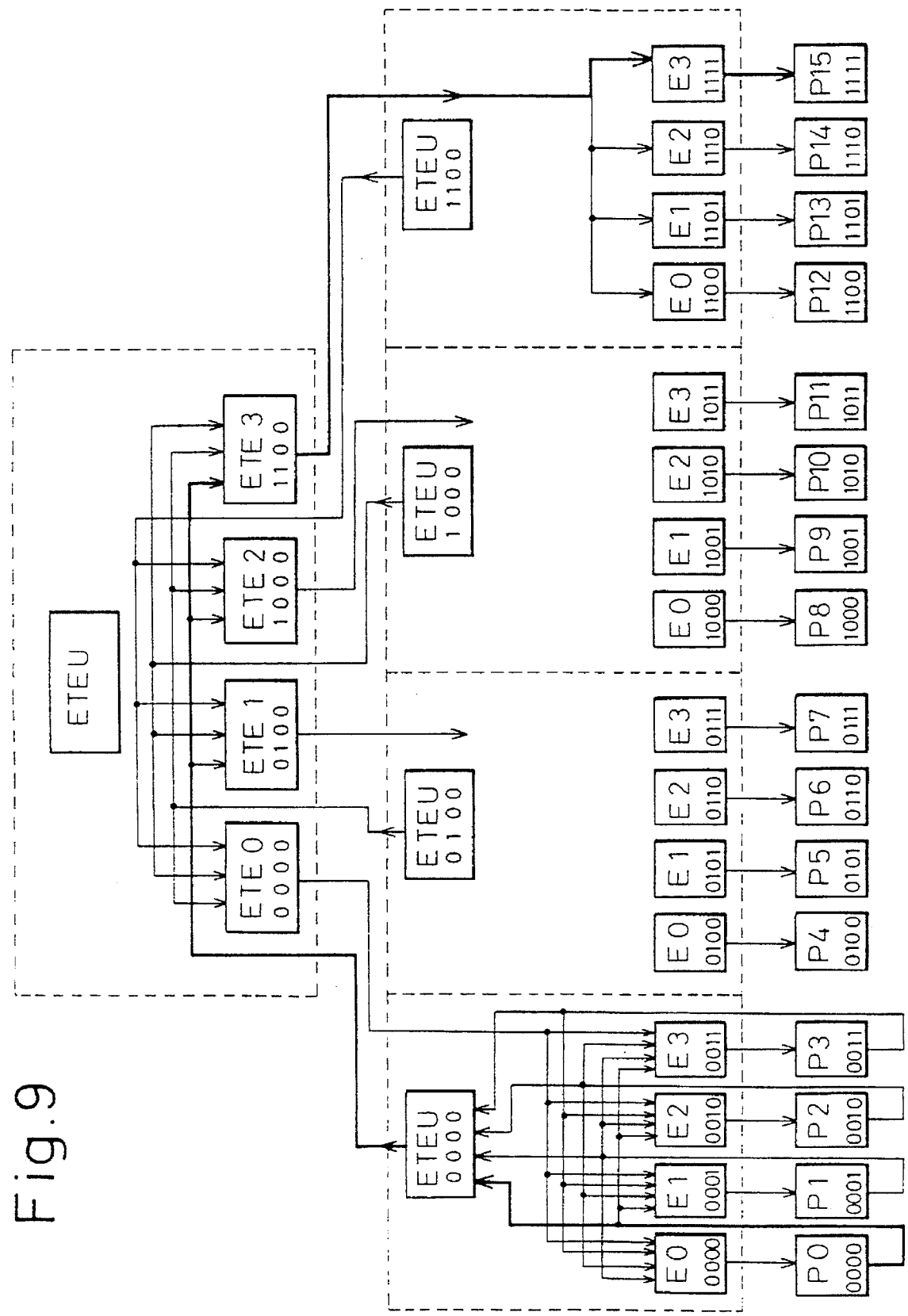

FIGS. 7 to 9 are explanatory views for the flow of the event packet. FIG. 7 shows the case of the configuration (4 PEs×4), FIG. 8 shows the case of the configuration (8 PEs×2) and FIG. 9 shows the case of configuration (16 PEs×1). In these drawings, thick lines indicate flow of the event packet.

Briefly, the event packet flows as follows. In this case, the processor element PE-No and the communication element number ETE-No are expressed by four bits. In four bits, the first digit is called the zero-th bit, the second digit is called the first bit, the third digit is called the second bit, and the fourth digit is called the third bit. For example, in the processor element PE-13 (1101), the first digit "1" is called the zero-th bit, the second digit "0" is called the first bit, the third digit "1" is called the second bit, and the fourth digit "1" is called the third bit, respectively.

The numbers of the communication elements ETE0 to ETE3 (E0 to E3, in FIGS. 7 to 9) of the lowest layer coincide with the corresponding numbers of the processor elements PE00 to PE03 (P0 to P3). When sending the event packet, the second and third bits of the elements ETE coincide with the second and third bits of the processor elements PE, and the zero-th and the first bits are set to bit "0".

The numbers of four communication elements ETEU at the second layer are "0000" (H0), "0100" (H4), "1000" (H8), and "1100" (HC), respectively. The communication unit ETEU at the highest layer is not used in this embodiment. When changing the configuration, the element ETE at each layer compares the processor number PE-No with the element number ETE-No based on the mode, and determines whether or not its own element should receive the event packet.

The following explanation is given with respect to the case of the configuration (4 PEs×4).

First, in FIG. 5, based on the switching command SWC from the configuration control processor CCP, the input terminal "0" of each selector SEL is selected in the input event selector IES. When the input "0" is selected, the event packet is independently output from each of input processors IP0 to IP3 to the corresponding clusters C1 to C4. That is, as shown in FIG. 4, the input processor IP0 sends the event packet to the cluster C1, the input processor IP1 sends the event packet to the cluster C2, the input processor IP2 sends the event packet to the cluster C3, and the input processor IP3 sends the event packet to the cluster C4.

In the case of FIG. 7, the processor element P0 (0000) includes the input processor IP0, and it is assumed that the event packet is sent from the processor element P0 (0000) to the processor element P3 (0011) (see, thick line). Accordingly, the number of destination processor is given by "0011" in FIG. 3B.

In the unit ETEU (0000), since the second and third bits "0" and "0" coincide with the second and third bits "0" and "0" of the destination processor element P3 (0011), the event packet does not flow to the upper element ETEU, but flows to the element E3. In the element E3 (0011), since the zero-th and first bits and "1" coincide with the zero-th and first bits "1" and "1" of the destination processor element P3 (0011), the event packet can pass from the processor element P0 to the destination processor element P3 (0011). As shown in FIG. 3B, the above is the case that the trace flag is "0".

The following explanation is given with respect to the case of the configuration (8 PEs×2).

First, in FIG. 5, based on the switching command SWC from the configuration control processor CCP, the selector SEL0 selects the input "0", the selector SEL1 selects the input "1", the selector SEL2 selects the input "0", and the selector SEL3 selects the input "2" in the input event selector IES. Accordingly, the input processor IP0 sends the event packet to the clusters C1 and C2, and the input processor IP2 sends the event packet to the clusters C3 and C4.

In the case of FIG. 8, the processor element P8 (1000) includes the input processor IP0, and it is assumed that the event packet is sent from the processor element P8 (1000) to the processor element P13 (1101) (see, thick line). Accordingly, the event number of destination processor is given by "1101" in FIG. 3B.

In the unit ETEU (1000), since the second bit does not coincide with the second bit "1" of the destination processor P13 (1101), the event packet can pass to the upper unit ETE3 (1100). In the unit ETE3, since the second bit "1" coincides with the second bit "1" of the destination processor P13 (1101), the event packet can pass to the lower element ETE1 (1101). In the element ETE1 (1101), since the zero-th, the first, and the second bits "1", "0" and "1" coincide with the zero-th, the first, and the second bits "1", "0" and "1" of the destination processor P13 (1101), the event packet can pass from the processor element P8 to the destination processor P13.

In the above case, in the upper four elements ETE0 to ETE3, the elements ETE0 and ETE1 are provided so as to cut off the routes accessed from the clusters 2 and 3, and the elements ETE2 and ETE3 are provided so as to cut off the routes accessed from the clusters 0 and 1, respectively.

The following explanation is given with respect to the case of the configuration (16 PEs×1).

First, in FIG. 5, based on the switching command SWC from the configuration control processor CCP, the selector SEL0 selects the input "0", the selector SEL1 selects the input "1", the selector SEL2 selects the input "1", and the selector SEL3 selects the input "1" in the input event selector IES. Accordingly, the input processor IP0 sends the event to the clusters C1, C2 and C3.

In the case of FIG. 9, the processor element P0 (0000) includes the input processor IP0, and it is assumed that the event packet is sent from the processor element P0 (0000) to the processor element P15 (1111) (see, thick line). Accordingly, the event number of destination processor is given by "1111" in FIG. 3B.

In the unit ETEU (0000), since the second and third bits "0" and "0" do not coincide with the second and third bits "1" and "1" of the destination processor P13 (1111), the event packet can pass to the upper element ETE3 (1100). In the element ETE3, since the second and third bits "1" and "1" coincide with the second and third bits "1" and "1" of the destination processor P15 (1111), the event packet can pass to the lower element ETE3 (1111). In the element ETE3 (1111), since all bits "1", "1", "1" and "1" coincide with all bits of the destination processor P15 (1111), the event packet can pass from the processor element P0 to the destination processor P15.

The basic operation of this embodiment is briefly explained below. The further explanations will be described with reference to FIGS. 10 and 11.

In FIG. 4, the host computer H loads the simulation model data into each processor element PE through the interface controllers IFC which define the simulation process. Further, the host computer H loads an input event data for the simulation model into the input processor IP. That is, the event data to be simulated is input to the input processor IP shown in FIG. 4.

Still further, the host computer H designates the trace flag in the event packet shown in FIGS. 3B and 3C. That is, when the trace flag is set to "1", the event data is sent to the output processor OP in its own processor element PE. When the trace flag is set to "0", the event data is sent to the destination processor element PE. Still further, the host computer H sets a condition, for example, to stop the simulation process and its time to be stopped, and supervision of the particular gate in the processor element PE.

When the host computer H sends a start instruction for the simulation process to the interface controller IFC after completion of above process, the simulation process is started. When stop condition of the simulation process occurs after the simulation is started, the simulation process is stopped.

Regarding the stop condition, the control processor CP of each cluster supervises the stop condition. When the stop condition occurs, the host computer informs the stop of the simulation process to a representative control processor CP which operates mainly in the simulation process. Further, the control processor informs the stop of the simulation process to the host computer. That is, when the control processor of each cluster detects stop condition, it informs the master control processor. The master control processor CP stops the simulation of all clusters, and informs stop of simulation to the host computer. The event (i.e., information of change of signal at the gate, and this information is defined in the state of FIG. 3A) is stored by the output processor OP through the unit ETE in its own cluster.

After completion of the simulation process, the host computer reads the event data stored in the output processor OP in order to analyze the contents of the event data.

Figure 10:
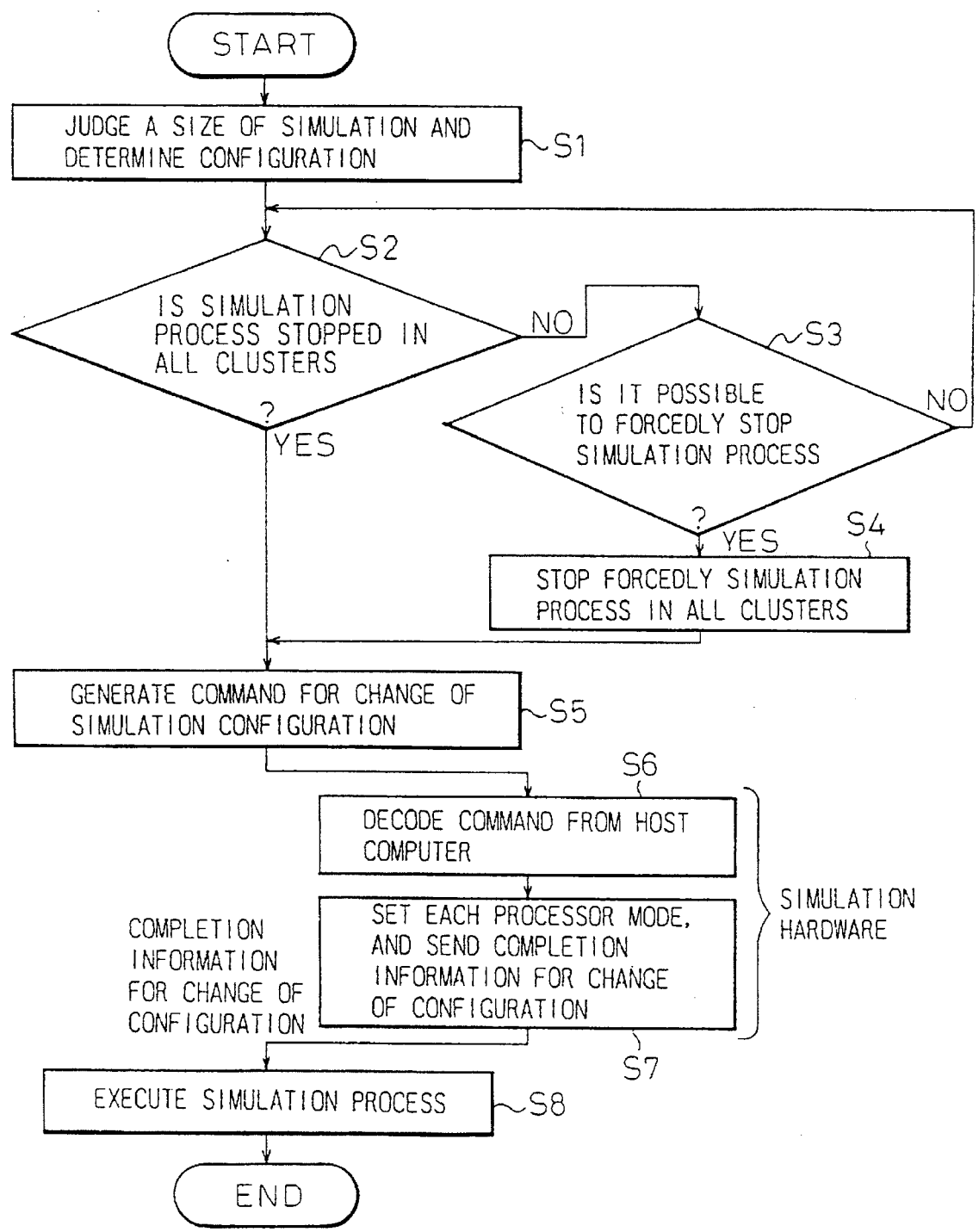
FIG. 10 is a flowchart explaining a change of configuration according to the present invention.

FIG. 10 is a flowchart explaining the change of configuration according to the present invention.

In step S1, an operator or the host computer judges a size of the simulation, and determines the configuration of the logic simulation apparatus. In step S2, the configuration control processor CCP determines whether or not all clusters are in the stop state. In step S3, when "NO" is detected in step S2, the operator judges whether it is possible to forcedly stop the simulation process.

In step S4, when "YES" in step S3, the host computer forcedly completes the simulation process of all clusters. When "NO" in step S3, the process returns to the step S2. In step S5, when "YES" in step S2, the host computer generates a configuration change command for the simulation.

In step S6, in the dedicated simulation hardware, the configuration control processor CCP decodes the instruction generated from the host computer. In step S7, in the dedicated simulation hardware, the configuration control processor CCP sets each processor mode and sends completion of change of configuration signal to the host computer. In step S8, the host computer executes the simulation process.

Figure 11:
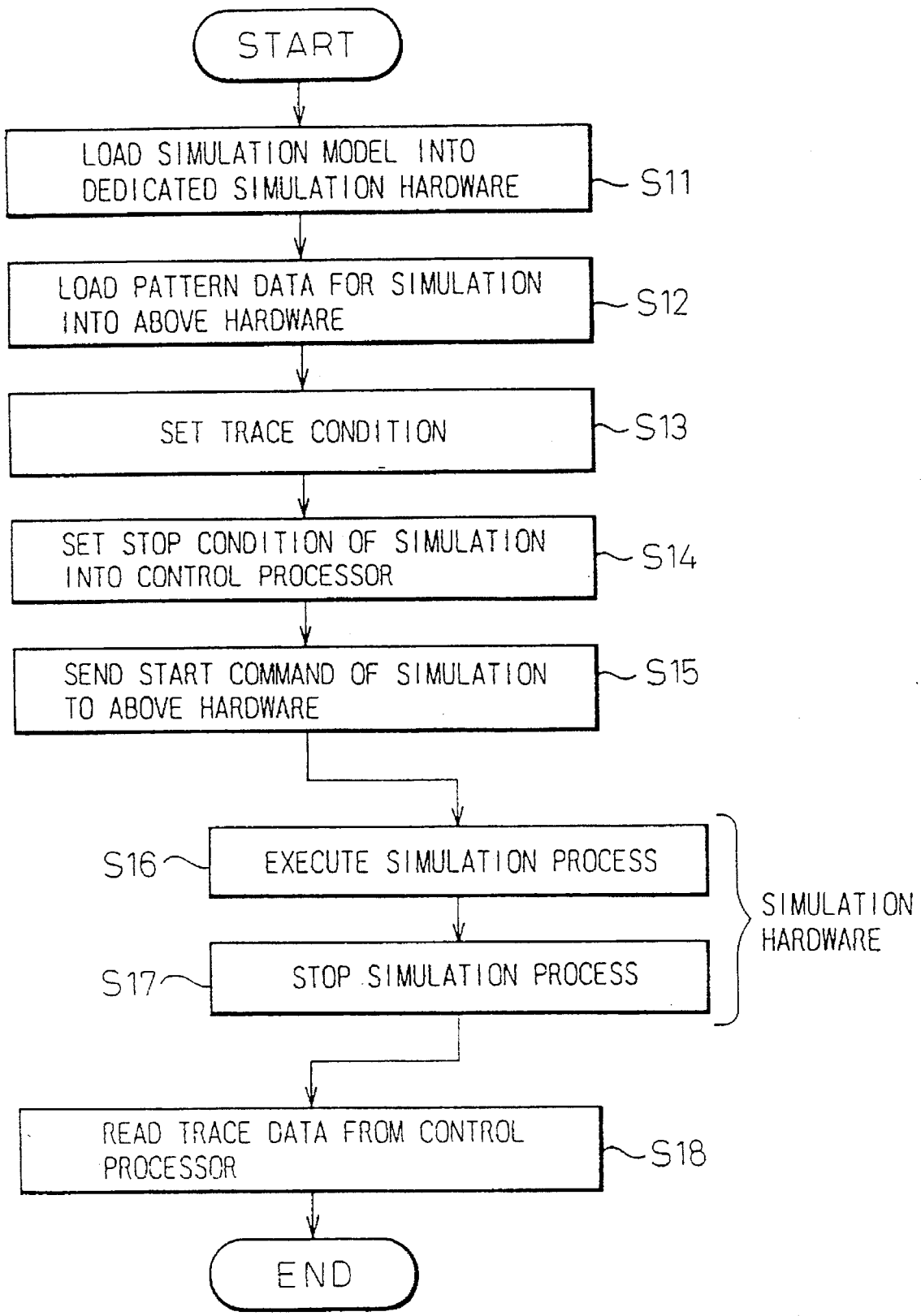
FIG. 11 is a flowchart explaining a simulation process according to the present invention.

FIG. 11 is a flowchart explaining simulation process according to the present invention. This flowchart shows detailed explanation of step S8 in FIG. 10.

In step S11, the host computer loads a simulation model, i.e., a logic circuit to be simulated, into the dedicated simulation hardware. In step S12, the host computer loads an input pattern for simulation, i.e., event data, to the dedicated simulation hardware through the input processor IP. In step S13, the host computer determines the trace condition, i.e., whether the trace flag is set to "1" or set to "0".

In step S14, the host computer determines the stop condition of the simulation process, for example, the time of the simulation process to be stopped. This condition is set into the control processor CP. In step S15, the host computer sends the start instruction of the simulation process to the configuration control processor CCP.

In step S16, the simulation process is executed in the dedicated simulation hardware through the configuration control processor CCP. In step S17, the simulation is stopped when the process is completed. In step S18, further, the host computer reads trace data, i.e., the contents of the output processor OP of the simulation dedicated hardware.

Next, an error analysis in the logic simulation apparatus will be explained in detail below.

As explained above, there are various types of the logic simulation apparatus, for example, a dedicated hardware type, a dedicated software type, an emulation type, etc. In general, a known RAS circuit is provided in the logic simulation apparatus in order to improve reliability, availability and serviceability of the apparatus. As example of the known RAS circuit, there are a parity circuit, an ECC (error correcting code) circuit, and a scanning circuit.

To ensure the perfect operation of the logic simulation apparatus, particularly, the dedicated hardware type, it is necessary to provide not only the above RAS circuits but also an inspection circuit for inspecting proper reliability of the logic simulation apparatus.

As one example of the problem regarding the reliability in the logic simulation apparatus, there is drop-out of the event or data when transferring it from one processor element PE to another processor element PE through the communication network. As explained above, the "event" indicates information of change of the signal, and the event is used for the evaluation of the logic simulation. In this case, it is very difficult to inspect the drop-out of the event or data. According to the present invention, it is possible to easily detect the drop-out of the event so that it is possible to improve the reliability of the logic simulation apparatus as explained below.

Figure 12:
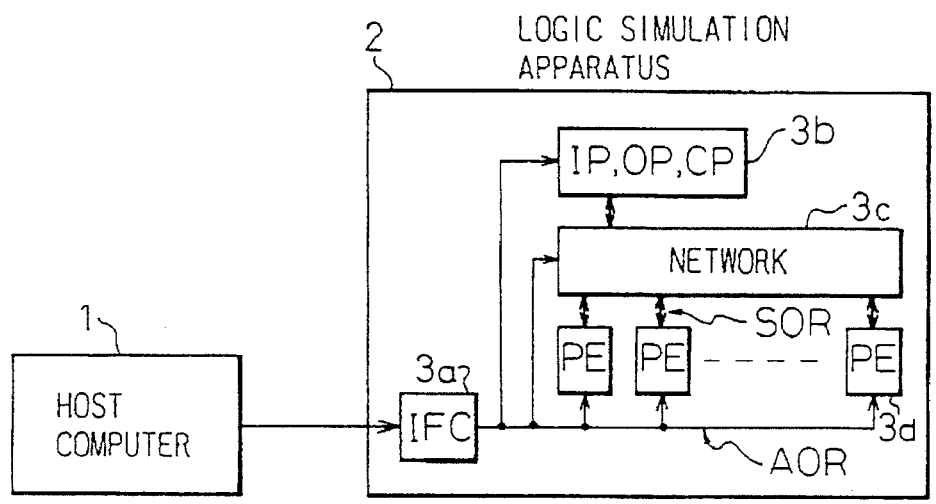
FIG. 12 is an explanatory view of system operation routes and access operation routes in the logic simulation apparatus according to the present invention.

FIG. 12 is an explanatory view of system operation routes and access operation routes in the logic simulation apparatus according to the present invention. This drawing corresponds to the structure of FIG. 1, and is shown from the viewpoint of error analysis. That is, reference number 1 denotes the host computer, and corresponds to the host computers H1 or H2 of FIG. 1. Further, reference number 2 denotes the logic simulation apparatus, and corresponds to the clusters C1 to Cn and the network ETN of FIG. 1.

In the logic simulation apparatus 2, reference number 3a denotes the interface controller IFC, 3b denotes the input processor IP, the output processor OP, and the control processor CP. Reference number 3c denotes the communication network which corresponds to the communication network ETN of FIG. 1, and 3d denotes processor elements PE which corresponds to the processor elements of FIG. 1. The thick lines indicate the system operation routes SOR used for the logic simulation process, and the thin lines indicate the access operation routes AOR used for the error analysis in order to improve the reliability of the logic simulation apparatus.

Figure 13:
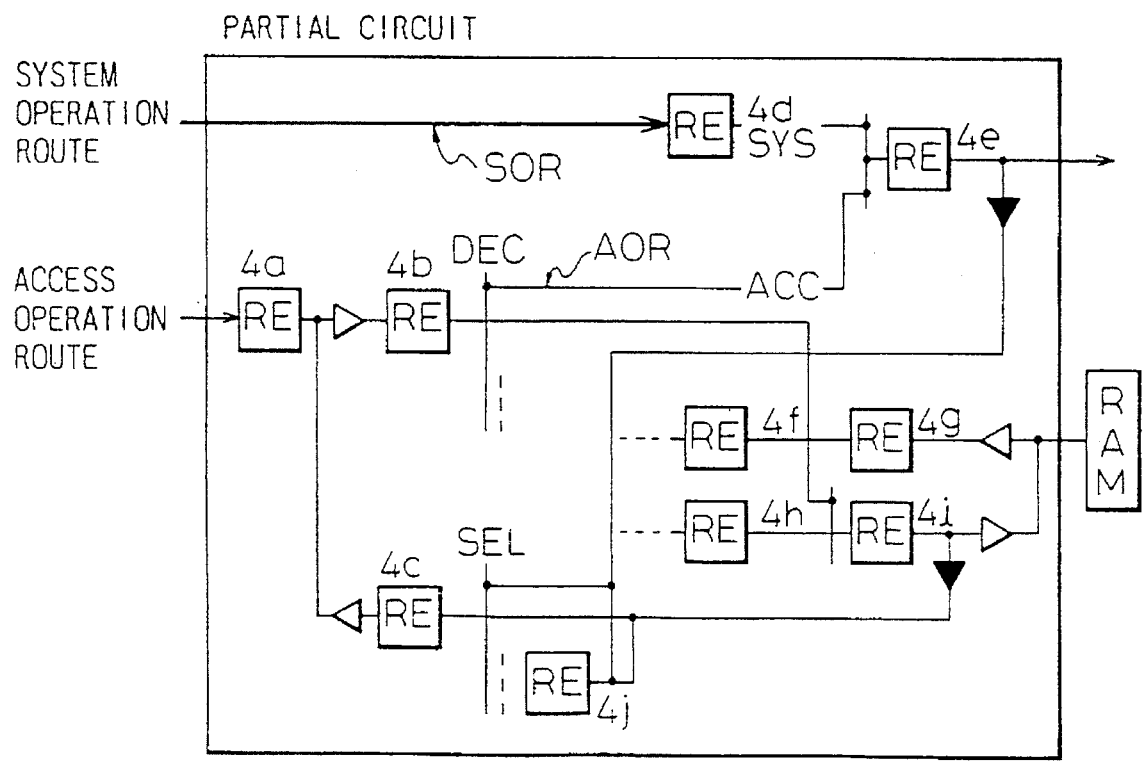
FIG. 13 is a detailed structure of a partial circuit included in all structural elements shown in FIG. 12.

FIG. 13 is a detailed structure of a partial circuit (memory access circuit) included in all structural units of FIG. 12. The partial circuit is provided for all structural units, i.e., the input/output/control processors 3b, the communication network 3c, processor elements 3d and the interface controller 3a in FIG. 12. In the drawing, the thick line SOR denotes the system operation route for the logic simulation, and the thin lines AOR denote the access operation route for error analysis.

Reference numbers 4a to 4j denote registers RE, and each of which is connected to either the system operation routes SOR or the access operation routes AOR in accordance with the function of the register. The error analysis is executed through the access operation routes AOR. That is, the result of the error detection in each register is read by the host computer through the access operation route. Further, EDC (see, FIG. 15) denotes an error detection circuit, DEC denotes a decoder, SEL denotes a selector, SYS denotes the system operation and ACC denotes the access operation. The error detection circuit EDC is used for detecting, for example, an error in the RAM memory.

Figure 14:
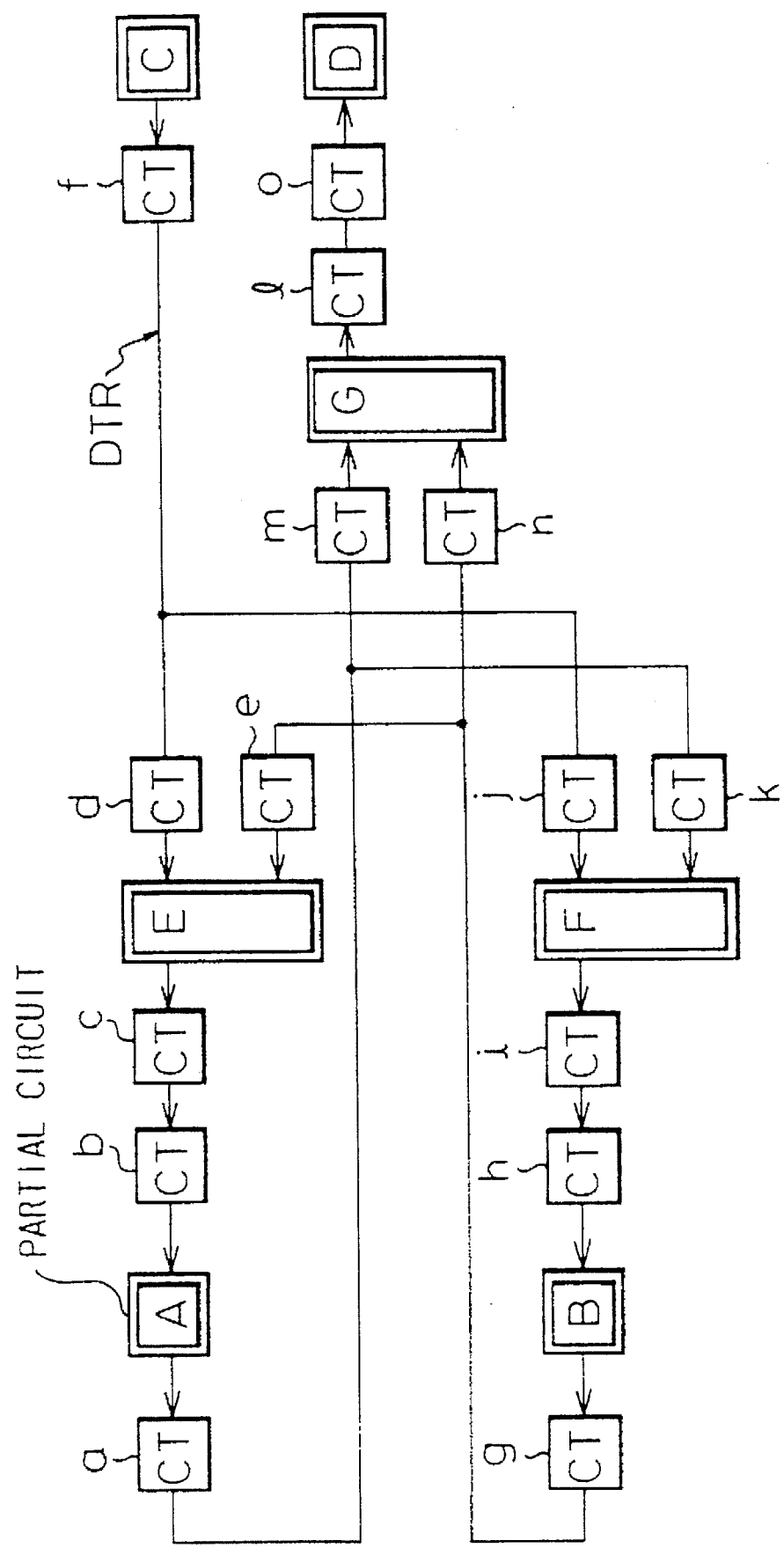
FIG. 14 is a basic structure of a transfer data counting circuit applied to the present invention.

FIG. 14 is a basic structure of a data transfer counting circuit applied to the present invention. The counters are provided for counting valid data passing through the data transfer routes. In the drawing, A to G denote partial circuits which correspond to the partial circuit of FIG. 13. Reference letters "a" to "o" denote counters for counting valid data passing through the data transfer route DTR. The arrows indicate direction of data transfer. According to this circuit, it is possible to detect drop-outs of events (or data) by referring to valid data in each of the counters.

The drop-out of data can be detected by referring to the contents of each counter in accordance with the following methods.

(1) detection of drop-out between partial circuits "b" to "a" =drop-out of partial circuit A, "h" to "g"=drop-out of partial circuit B, "d"+"e" to "c"=drop-out of partial circuit E, "j"+"k" to "i"=drop-out of partial circuit F, and "m"+"n" to "l"=drop-out of partial circuit G.

(2) detection of drop-out on transfer routes "c" to "b"=drop-out of between circuits A and E, "i" to "h"=drop-out of between circuits B and F, "l" to "o"=drop-out of between circuits G and D, "m"+"k" to "a"=drop-out of between circuits A and F, G, "e"+"n" to "g"=drop-out of between circuits B and E, G, and "d"+"j" to "f"=drop-out of between circuits C and E, F.

According to the above formula (1) and (2), it is possible to easily detect drop-out of data and drop-out portion in the circuit.

Figure 15:
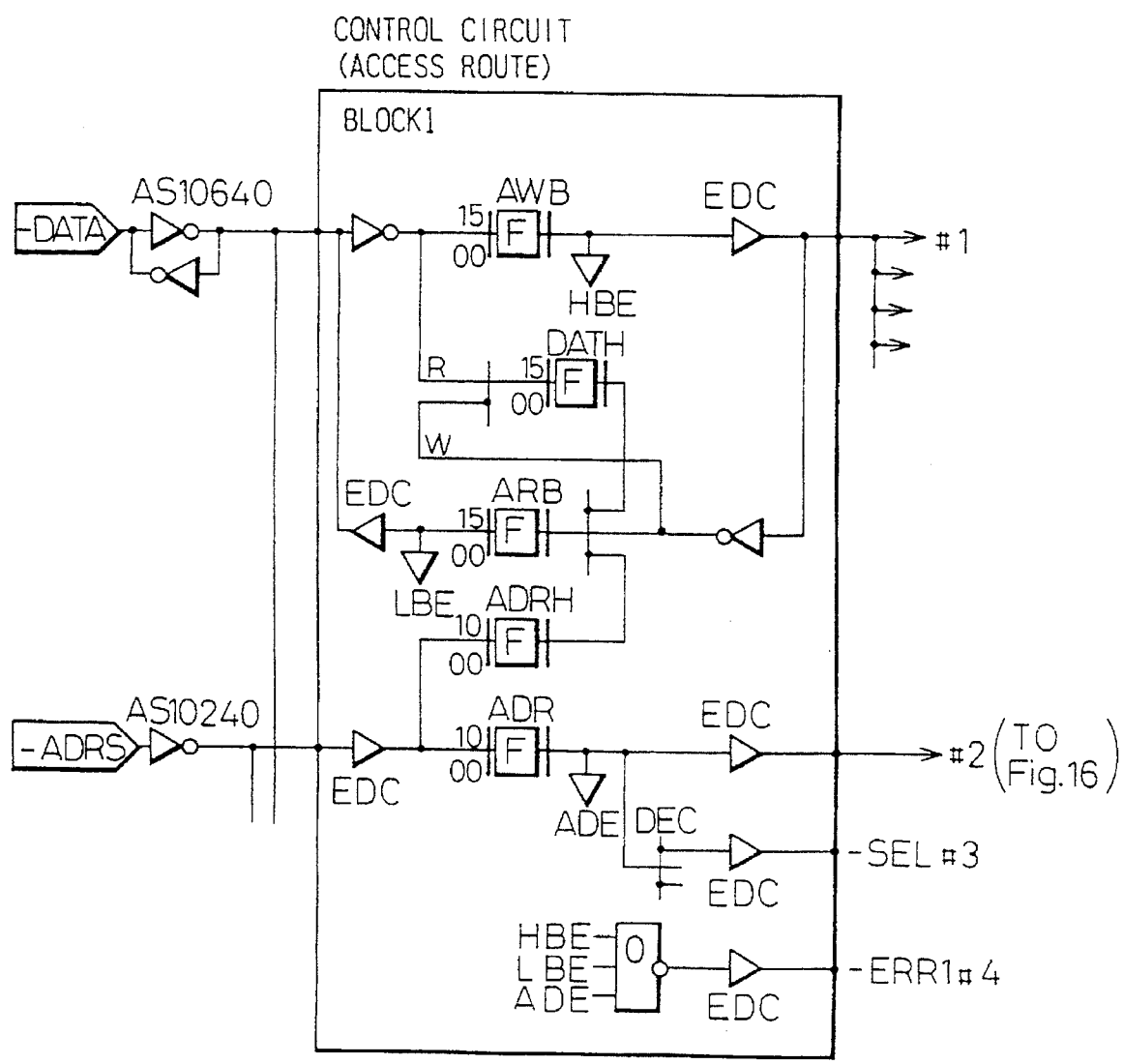
FIGS. 15, 16 and 17 are schematic block diagrams of an error analysis system according to an embodiment of the present invention.
Figure 16:
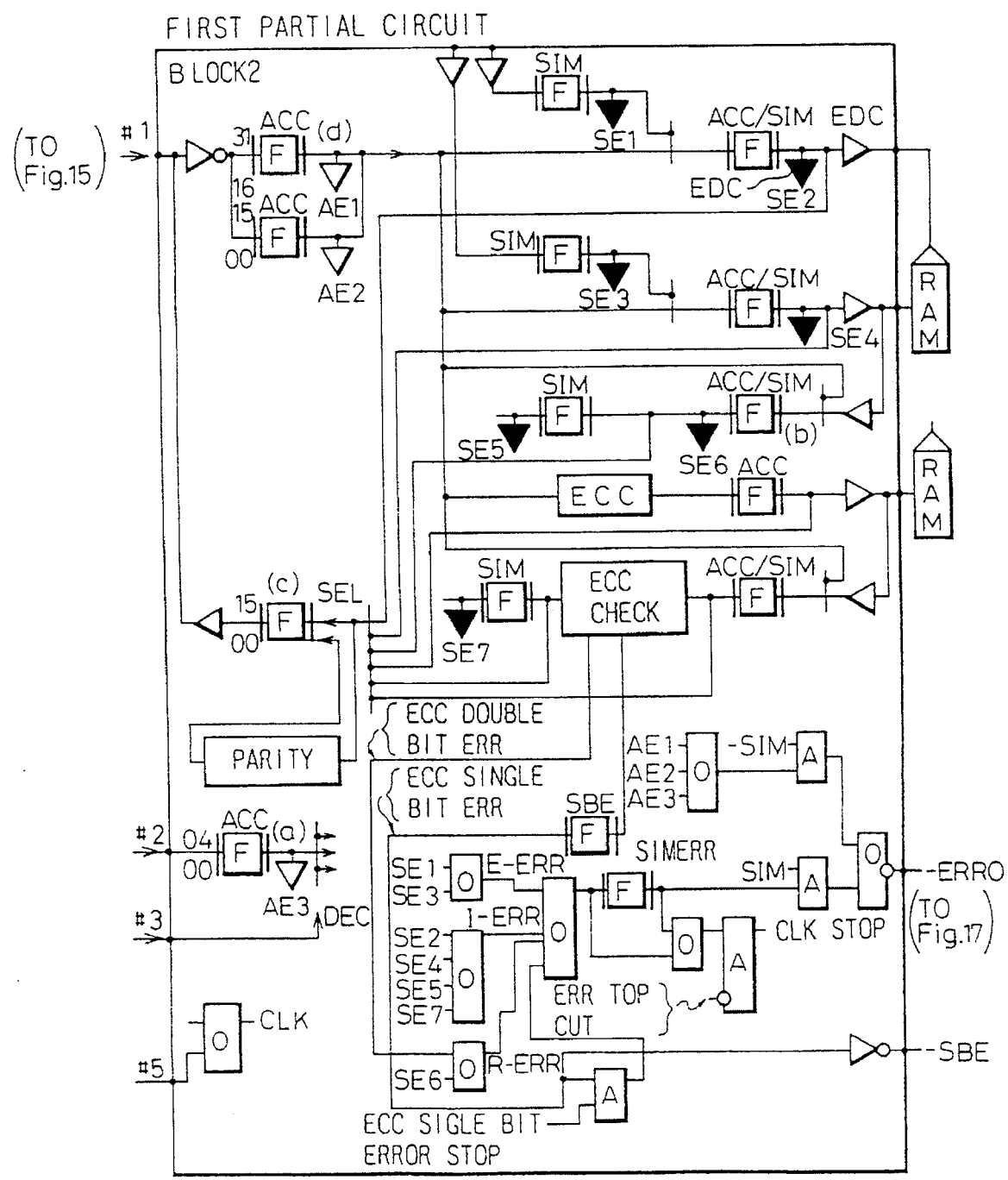
Figure 17:
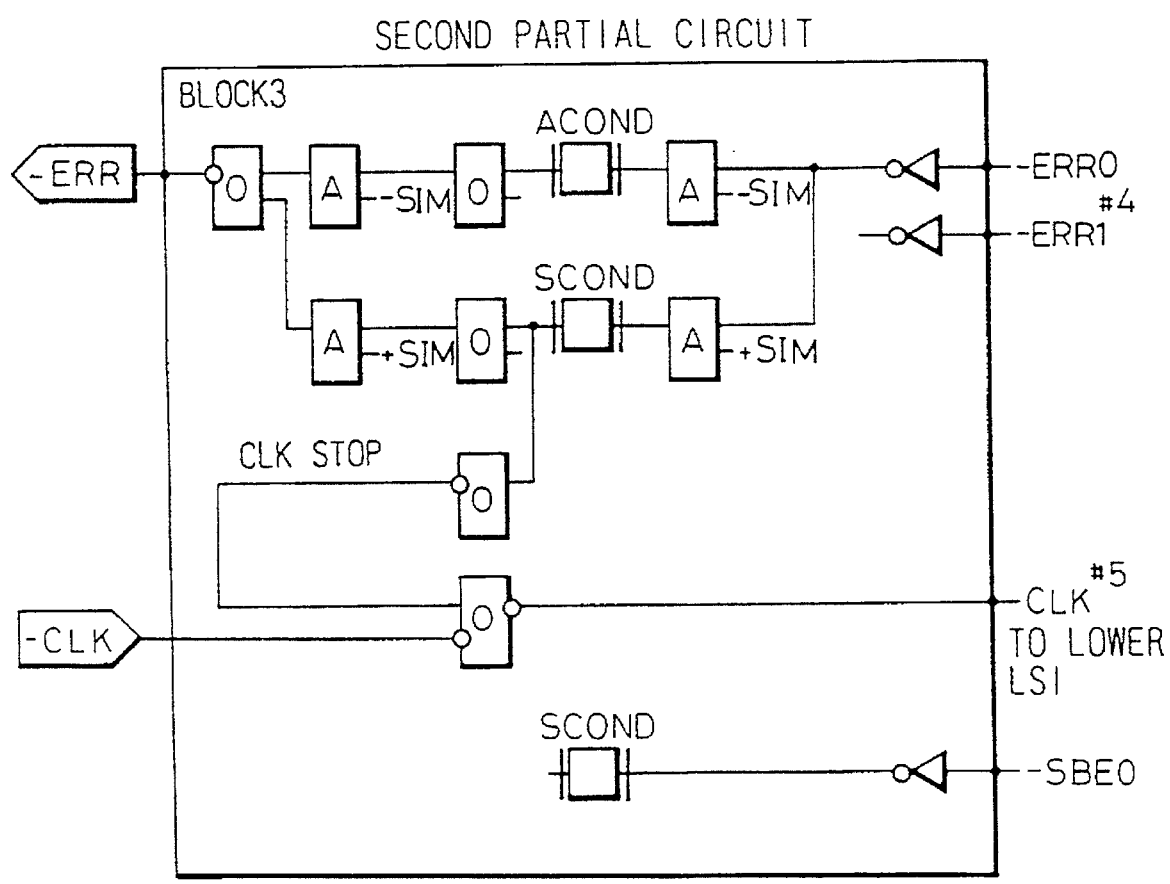

FIGS. 15 to 17 are schematic block diagrams of an error analysis system according to an embodiment of the present invention. The error analysis system according to the present invention is formed by combining all blocks 1 to 3. FIG. 15 shows a control circuit provided on for an access operation route (below, block 1), FIG. 16 shows a first partial circuit provided in the structural units (below, block 2), and FIG. 17 shows a second partial circuit provided in the structural units (below, block 3).

In these drawings, "O" denotes an OR gate, "A" denotes an AND gate, and "F" denotes a flip-flop circuit. In this embodiment, there are five kinds flip-flop circuits F in the blocks as follows.

ACC is used for only access operation,
ACC/SIM is used for access/simulation operation,
SIM is used for only simulation operation,
SIM-ERR is used for error detection of simulation circuit, and
ACOND and SCOND are used for holding data.

The symbol "∇" denotes an error detection circuit EDC provided on the access operation route, and the symbol "▼" denotes an error detection circuit provided on the simulation operation route. The flip-flop ACC is provided on the access operation route, and the flip-flop SIM is provided on the system operation route.

The contents of the access/simulation common flip-flop ACC/SIM can be detected or set through both access/system operation routes. In this embodiment, in order to realize the access/simulation common flip-flop, selectors are provided for the input side of the common flip-flop for selecting the access operation route or the system operation route at the data setting stage so that it is possible to set data for both operation routes. Further, the output of the selectors are connected to both registers for both access/system operation routes as explained in detail below.

In FIG. 16, block 2 includes error detection circuits EDC. The error detection circuits EDC (see, symbols ∇ and ▼) are provided for the outputs of the flip-flops SIM, ACC and ACC/SIM. The errors are divided into three groups, i.e., an external error (E-ERR) sent from an outside of the block 2, an internal error (I-ERR) generated therein, and a RAM error (RAM-ERR) generated in the RAM. That is, SE1 and SE3 are system errors generated from the external stage through the flip-flop SIM, and input to the OR gate (see, lower portion of the drawing). SE2, SE4, SE5 and SE7 are system errors generated within this block 2, and input to the OR gate. Further, SE6 is a system error generated by the memory RAM. In this case, the direction of the error detection circuit EDC corresponds to the flow of the data (i.e., error).

The external error E-ERR, the internal error I-ERR and the RAM error R-ERR are input to the OR gate and the result of the OR gate is input to the flip-flop F so that the system error SIM-ERR is output to the AND gate.

Further, AE1, AE2 and AE3 indicate the access errors at the flip-flop ACC, and the errors are input to the OR gate as shown in the lower portion of the drawing. Further, the output of the OR gate and the system error SIM are input to the AND gate. The outputs of two AND gates are input to the OR gate and output as the error ERRO. The error ERR is input to the error terminal ERR of block 3 (FIG. 17). In this case, the result of the ECC check, i.e., an ECC double bit error or an ECC single bit error, is used for detection of the memory error R-RAM.

In the block 2, the contents of the flip-flops SBE and SIM-ERR indicate the state of the block 2. That is, the flip-flop SBE checks ECC data of the RAM which is accessed in this block, and holds the indication of the error. The flip-flop SIM-ERR holds the indication of the errors generated in this block 2.

According to error analysis by block 2, the kind of error is easily detected by referring to these registers and flip-flops. Further, the error portions to be repaired are easily recognized.

In FIG. 17, the block 3 includes an error input terminal (-ERR). The errors indications from the blocks 1 and 2 are held in the registers ACOND and SCOND through the OR gate and the AND gate. Accordingly, the error block is easily recognized by referring to the contents of these registers ACOND and SCOND. Further, the error portion in the blocks 1 to 3 is easily detected. The clock CLK is stopped when the error data must be held.

In the block 1 of FIG. 15, the registers ADRH and DATH are provided for holding data passing through the access operation route. Further, data including errors are held in the register DATH by always supervising the data therein. When the data is accessed through the access operation route, the address for defining the accessed location is held at the same time so that it is possible to define the the position of the error in the access operation route.

Figure 18:
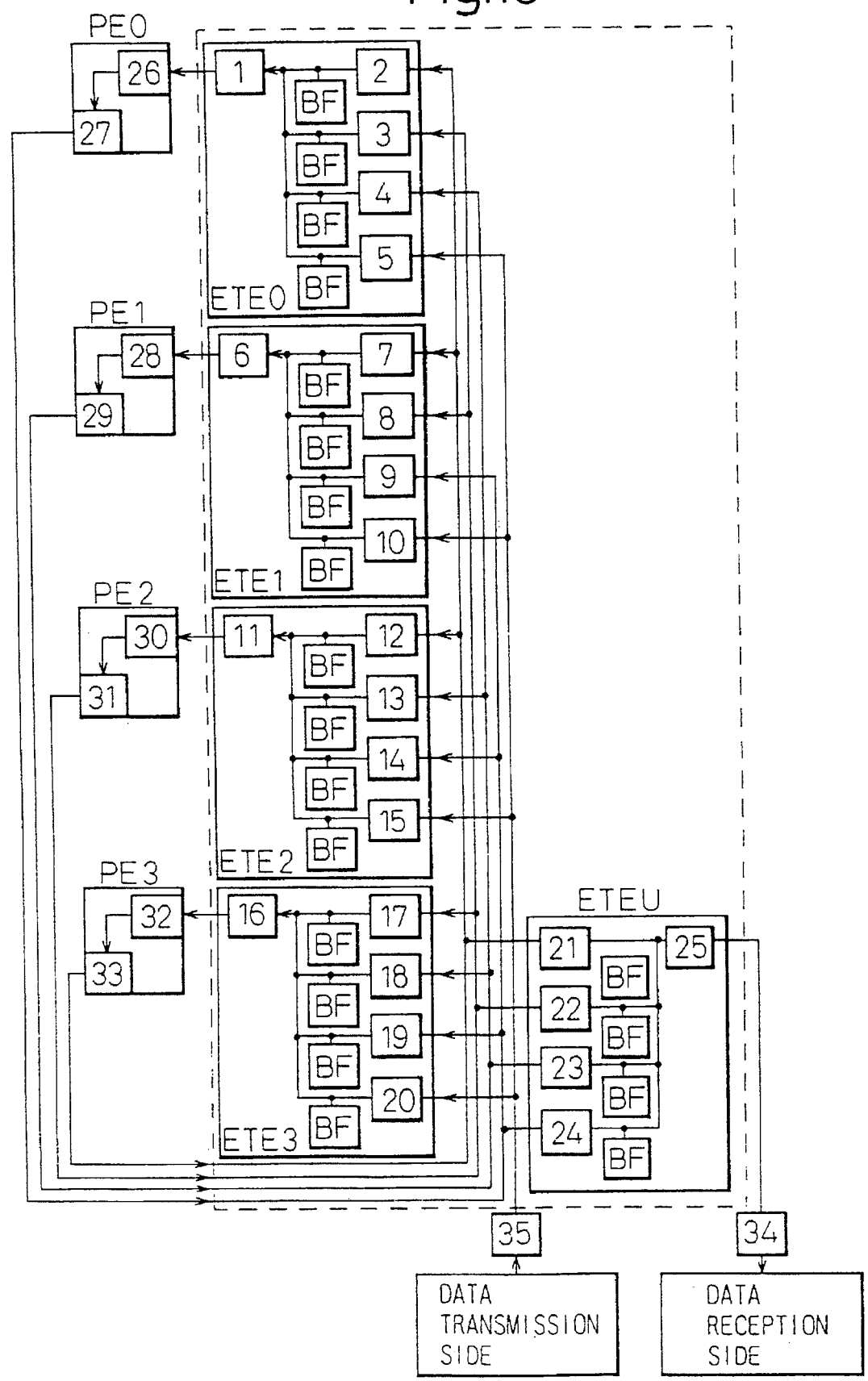
FIG. 18 is a schematic block diagram of a transfer error analysis system according to an embodiment of the present invention.

FIG. 18 is a schematic block diagram of a transfer error analysis system according to an embodiment of the present invention. This drawing shows another embodiment of FIG. 2. In FIG. 18, PE0 to PE3 denote processor elements, ETE0 to ETE3 and ETEU denote network units, BFs denote buffer memories, and CTs denote counters. As shown in the drawing, each processor element PE includes the counter CT as the partial circuit, and each communication element ETE includes the counter CT and the buffer memory BF as a partial circuit. The data are sent toward the arrow marks. A data drop-out is detected by using the counters provided on the transfer routes as follows.

(1) data drop-out within the communication element ETE, (2+3+4+5)−1=drop-out within element ETE0, (7+8+9+ 10)−6=drop-out within element ETE1, (12+13+14+15)− 11=drop-out within element ETE2, (17+18+19+20)−16= drop-out within element ETE3, and (21+22+23+24)−25= drop-out within element ETE4.

(2) data drop-out between element ETE and processor element PE 1−26=drop-out between ETE0 and PE0, 6−28=drop-out between ETE1 and PE1, 11−30=drop-out between ETE2 and PE2, and 16−32=drop-out between ETE3 and PE3.

(3) data drop-out between processor element PE and element ETE 27−(9+14+17+24)=drop-out between PE0 and ETE, 29−(4+13+18+23)=drop-out between PE1 and ETE, 31−(3+8+17+22)=drop-out between PE2 and ETE, and 33−(2+7+12+21)=drop-out between PE2 and ETE.

(4) data drop-out between element ETE and transmission side 35−(5+10+15+20)=drop-out between PE2 and ETE (5) data drop-out between element ETE and reception side 25−34=drop-out between element ETE and reception side Next, an acquisition process of device data through the access operation route in FIGS. 15 to 17 will be explained below.

(1) When an address which indicates an object device (i.e., flip-flop, registers, RAM, etc.) is applied from the terminal ADRS in FIG. 15, the address reaches to the register (a) in FIG. 16 through the register ADR of the block 1. The address is decoded in the register ADR.

(2) The data of the register (b), which is indicated by the step (1), is transferred through the access operation route, and transferred to the register ARB of the block 1 of FIG. 12 so that the data of the objected device is displayed on the data terminal.

A process of setting device data through the access operation route in FIGS. 15 to 17 will be explained below.

(1) When an address which indicates an object device (i.e., flip-flop, registers, RAM, etc.) is applied from the terminal ADRS in FIG. 15, the address reaches to the register (a) in FIG. 16 through the register ADR of the block 1. The address is decoded by the register ADR.

(2) The data to be set is applied from the data terminal, and reaches to the register (d) of the block 2 through the register AWB of the block 1.

(3) The register, which is designated by the step (1), is opened so that the data of the register (d) is set to the object register through the passing route.

A process of collecting error information through the system route in FIGS. 15 to 17 will be explained below.

(1) The errors SE1 to SE7 are output from the flip-flop circuits.

(2) The outputs from flip-flops are collected by the OR gates in accordance with the kind of error.

(3) The data is held in the register SIM-ERR. The clock signal CLK, which is applied into the partial circuit, is stopped. Further, the errors are transferred to the block 3 (see, FIG. 14).

(4) In the block 3, the error signals from blocks 1 to 3 are collected to the register SCOND, and transferred to the error terminal ERR in order to notice the error data to the upper block.

A process of collecting error information through the access route in FIGS. 15 to 17 will be explained below.

(1) The errors AE1 to AE3 are output from the flip-flops.

(2) The outputs from the flip-flops are collected in accordance with the kind of the error.

(3) The data is held in the register SIM-ERR. The clock signal CLK, which is applied to the partial circuit, is stopped. Further, the access error is transferred to the upper block 3 (see, FIG. 14).

(4) In the block 3, the error signals from blocks 1 to 3 are collected to the register ACOND, and transferred to the error terminal ERR in order to pass the error data to the upper block.

Figure 19:
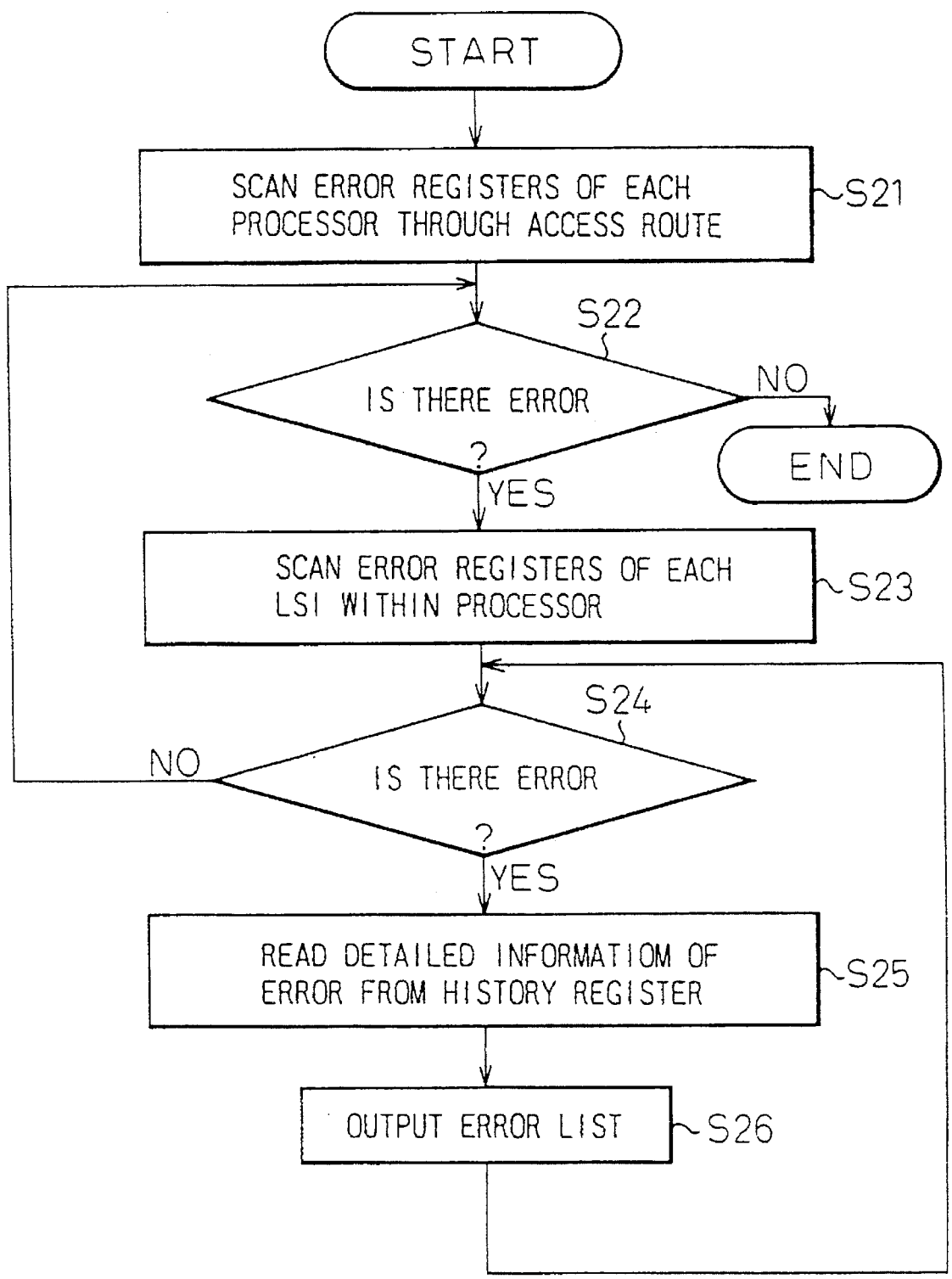
FIG. 19 is a flowchart explaining error analysis according to the present invention.

FIG. 19 is a flowchart explaining error analysis according to the present invention.

In step S21, the host computer scans error registers which are provided in each processor. In step S22, the host computer detects whether there are errors in each register. In step S23, the host computer scans error registers which are provided in each LSI (large scale integrated) circuits within each processor element. In step S24, the host computer detects whether there are errors in each register. In step S25, the host computer reads detailed information of data from the history register. In step S26, the host computer outputs the error list.

Figure 20:
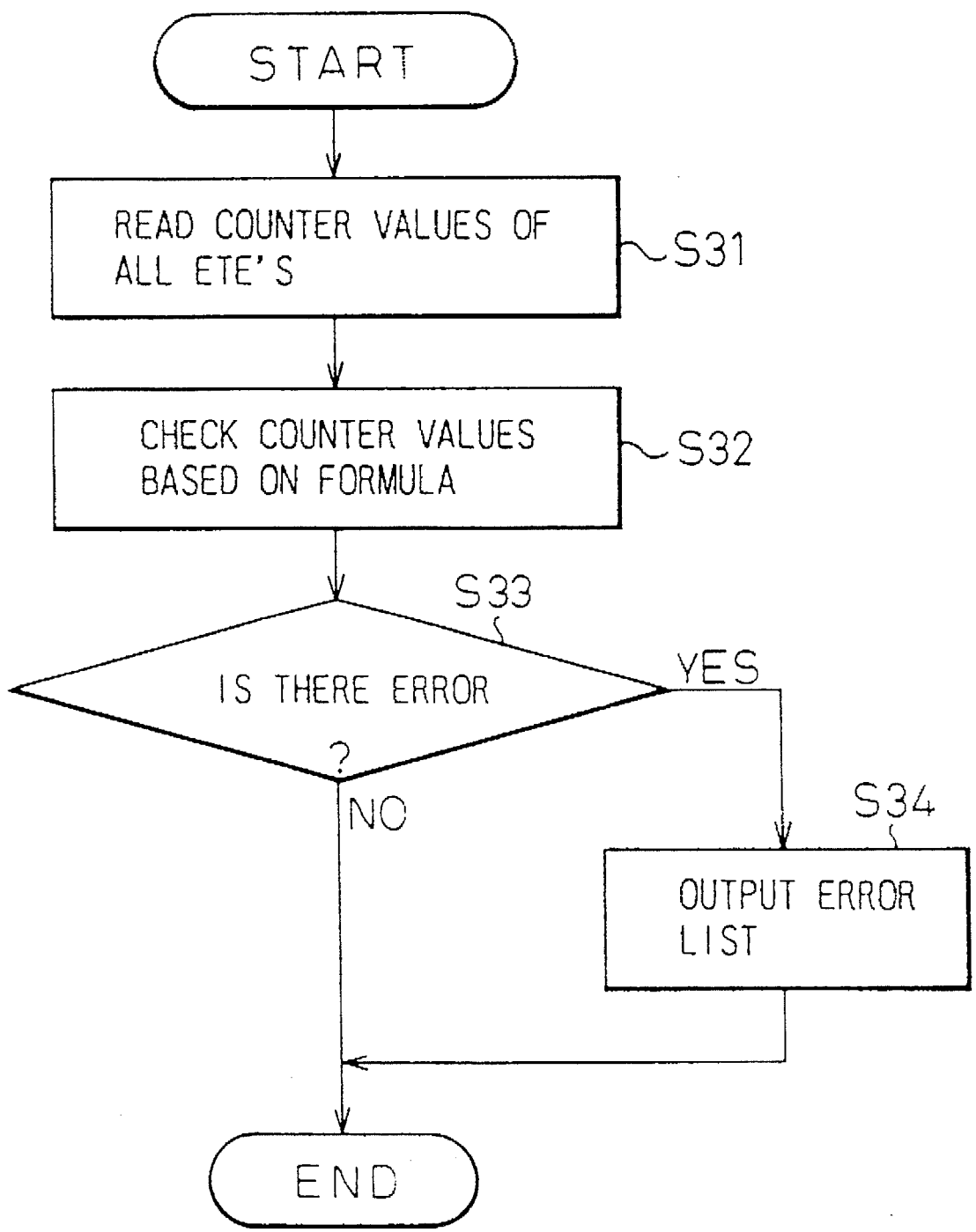
FIG. 20 is a flowchart explaining detection of dropout of data and event according to the present invention.

FIG. 20 is a flowchart explaining detection of a drop-out of the event according to the present invention. In step S31, the host computer reads the counter values from all elements ETE. In step S32, the host computer checks adjustability of the counter values (i.e., whether the counter values are correct) in accordance with the formula which is explained above. In step S33, the host computer judges whether there are errors in each register. In step S34, the host computer outputs the error list.

We claim:

1. A logic simulation apparatus comprising dedicated hardware simulating a logic operation of at least one logic circuit, and connected to at least one host computer, said logic simulation apparatus comprising:

a plurality of clusters, each cluster comprising at least a communication network and a plurality of processor elements connected to each other through said communication network and forming a connection configuration, each of said plurality of clusters comprising:

an event communication network connecting the processor elements and transferring an event packet thereamong;

an input processor connected to said event communication network through a signal line and inputting said event packet;

an output processor connected to said event communication network through said signal line and storing a history of said event packet;

an interface controller connected to said at least one host computer through a channel and further connected to said processor elements through a system bus; and a control processor operatively connected to said system bus for controlling an operation of each processor element; and an upper communication network connecting said clusters;

said at least one host computer being connect to at least one of the plurality of clusters, wherein the connection configuration among said plurality of clusters is changeable in accordance with a size of the logic operation being simulated, under instructions for configuration change generated by said at least one host computer wherein said connection configuration is changed in such a way that each cluster is selected to form a desired processing scale for simulation, all clusters are selected to form a plurality of cluster groups in accordance with the desired processing scale for simulation, and each cluster group is operated independently of each other; and wherein all clusters are selected to form one processing scale for simulation.

2. A logic simulation apparatus as claimed in claim 1, wherein said output processor stores data previously designated by said at least one host computer to be simulated in its own cluster through said communication network; and when each cluster operates independently, said at least one host computer reads contents of each output processor after completion of a simulation process, and when all clusters operate integratedly, one of the at least one host computer reads said contents of all output processors after completion of said simulation process.

3. A logic simulation apparatus as claimed in claim 1, wherein said control processor checks data previously designated by said at least one host computer to be simulated in its own cluster through said communication network and detects change of said data; and when each cluster operates independently, said control processor stops said simulation process when a stop condition is generated based on a result of a check in each output processor, and when all clusters operate integratedly, said control processor stops said simulation process when the stop condition is generated based on a result of the check in any one of said output processors.

4. A logic simulation apparatus as claimed in claim 1, further comprising:

an input event selector connected between said input processor and said event communication network for selecting at least one of the plurality of clusters;

a plurality of switch means for connecting between adjacent clusters; and a configuration control processor operatively connected to said at least one host computer through said channel, receiving a switching control instruction input from said at least one host computer and generating a switching command to said input even selector to form said processing scale for simulation.

5. A logic simulation apparatus as claimed in claim 1, wherein each of said plurality of processor elements has a successive number which is defined by "n" bits, and communication between said processor elements is performed by transferring said event packet comprising a processor number, a gate number and an event state.

6. A logic simulation apparatus as claimed in claim 1, wherein said event communication network comprises a plurality of communication units comprising a hierarchical stage, each communication unit comprises a plurality of communication elements comprising a hierarchical layer, and communication elements of a lower layer are connected to the processor elements are defined by said number of a corresponding one of said processor elements.

7. A logic simulation apparatus as claimed in claim 6, wherein a communication element of an upper layer is connected to said communication elements of said lower layer, and is defined by a number corresponding to a first processor element to which an upper communication element belongs.

8. A logic simulation apparatus as claimed in claim 6, wherein said communication element compares a number of a destination processor element, provided in said event packet, with said element's own number, and determines whether said event packet should be passed-on in accordance with said result of said comparison.

9. A logic simulation apparatus as claimed in claim 8, wherein, as a result of a comparison of the communication element, a passing route for the event packet is changed in accordance with a change of the configuration of clusters.

10. A logic simulation apparatus as claimed in claim 6, wherein each of said communication elements comprises an element address which is formed of a mode indicating the configuration of the clusters, a hierarchical stage for indicating a location of the communication unit, a direction of event which is transferred in the communication element, and a number of the communication element.

11. A logic simulation apparatus as claimed in claim 4, wherein said input event selector comprises "n" selection units and one mode selection unit, each selection unit being connected to a corresponding input processor, each input processor being selected to transfer said event packet from each input processor to a corresponding cluster when each cluster operates independently, and one input processor being selected to transfer said event packet from one input processor to all of said clusters.

12. A logic simulation apparatus as claimed in claim 4, wherein said configuration control processor acquires a present state of other clusters through said interface controller, returns a state of other clusters, said state indicating whether said simulation process is performed, when receiving a query from said at least one host computer, changes a configuration of said clusters after completion of said simulation process, and forcedly completes said simulation process in accordance with the instructions from said at least one host computer when any one cluster does not complete said simulation process.

13. A logic simulation apparatus as claimed in claim 1, further comprising:

an access operation route connecting to said at least one host computer; and a system operation route connecting said processor elements to said communication network.

14. A logic simulation apparatus as claimed in claim 13, wherein a plurality of counter means for counting valid data which are transferred between said communication units are provided on the system operation route connecting said processor elements.

15. A logic simulation apparatus as claimed in claim 13, wherein each structural unit comprising input/output/control processors, said communication network, and said processor elements, in said logic simulation apparatus comprises a partial circuit for error analysis.

16. A logic simulation apparatus as claimed in claim 15, wherein said partial circuit comprises a plurality of Reliability, Availability and Serviceability circuits comprising an ECC circuit, for checking operation of said partial circuit, a plurality of registers storing a result of a check at said Reliability, Availability and Serviceability circuits, and flip-flops for defining errors in each partial circuit.

17. A logic simulation apparatus as claimed in claim 15, wherein a plurality of counter means are for counting valid data which are transferred between said communication units are provided on the system operation route connecting said partial circuits.

18. A logic simulation apparatus as claimed in claim 13, wherein said access operation route is used for error analysis of said logic simulation apparatus and corresponds to said system bus, and said system operation route is used for the simulation process and corresponds to said signal line.

* * * * *